US010267896B1

(12) United States Patent
Rodenbeck et al.

(10) Patent No.: US 10,267,896 B1
(45) Date of Patent: Apr. 23, 2019

(54) VARIABLE BANDWIDTH FILTER

(71) Applicants: National Technology & Engineering Solutions of Sandia, LLC, Albuquerque, NM (US); Jose Silva-Martinez, College Station, TX (US); John Mincey, Bryan, TX (US); Eric Su, Santa Clara, CA (US)

(72) Inventors: Christopher T. Rodenbeck, Alexandria, VA (US); Jose Silva-Martinez, College Station, TX (US); John Mincey, Bryan, TX (US); Eric Su, Santa Clara, CA (US)

(73) Assignees: National Technology & Engineering Solutions of Sandia, LLC, Albuquerque, NM (US); Jose Silva-Martinez, College Station, TX (US); John Mincey, Bryan, TX (US); Eric Su, Santa Clara, CA (US)

( * ) Notice: Subject to any disclaimer, the term of this patent is extended or adjusted under 35 U.S.C. 154(b) by 605 days.

(21) Appl. No.: 14/828,677

(22) Filed: Aug. 18, 2015

Related U.S. Application Data

(60) Provisional application No. 62/040,356, filed on Aug. 21, 2014, provisional application No. 62/040,343, filed on Aug. 21, 2014.

(51) Int. Cl.
*G01S 7/282* (2006.01)
*G01S 7/285* (2006.01)

(52) U.S. Cl.
CPC .............. *G01S 7/285* (2013.01); *G01S 7/282* (2013.01)

(58) Field of Classification Search
CPC ........... G01S 7/85; G01S 7/282; H03H 15/00; H03H 11/0433; H04B 1/28; H04B 1/30;
(Continued)

(56) References Cited

U.S. PATENT DOCUMENTS

| 4,083,049 A * | 4/1978 | Mattern | G01S 13/5265 342/159 |
| 5,375,146 A * | 12/1994 | Chalmers | H04B 1/30 375/344 |

(Continued)

FOREIGN PATENT DOCUMENTS

| EP | 0815651 B1 * | 9/2002 | ............ H03M 3/396 |
| EP | 2522073 A1 * | 11/2012 | ............... H03F 3/19 |
| EP | 2777231 A1 * | 9/2014 | ............... G06G 7/18 |

OTHER PUBLICATIONS

Sanchez-Renedo, et al., "Tunable Combline Filter With Continuous Control of Center Frequency Bandwidth", IEEE Transactions on Microwave Theory and Techniques, vol. 53, No. 1, Jan. 2005, pp. 191-199.

*Primary Examiner* — Timothy A Brainard
*Assistant Examiner* — Nuzhat Pervin
(74) *Attorney, Agent, or Firm* — Medley, Behrens & Lewis, LLC

(57) ABSTRACT

A variable bandwidth filter is described herein, wherein a bandwidth of a passband of the variable bandwidth filter is dynamically tunable. The variable bandwidth tuner is implemented on a CMOS chip, and acts to filter analog signals. The variable bandwidth filter comprises a plurality of finite impulse response (FIR) filters, wherein each FIR filter comprises a plurality of tunable transconductors. The tunable transconductors are tunable in their gain.

16 Claims, 19 Drawing Sheets

(58) Field of Classification Search
CPC ......... H04B 1/0007; H03F 3/602; H03F 3/19; H03F 1/3211; H03D 3/007; H03J 3/06; G06G 7/18
USPC .......................................................... 342/204
See application file for complete search history.

(56) References Cited

U.S. PATENT DOCUMENTS

| | | | | |
|---|---|---|---|---|
| 5,479,168 A * | 12/1995 | Johnson | ................... | G06J 1/00 |
| | | | | 341/110 |
| 5,661,432 A * | 8/1997 | Chang | ................ | H03H 11/0422 |
| | | | | 327/103 |
| 5,867,535 A * | 2/1999 | Phillips | ................... | G01S 1/04 |
| | | | | 375/295 |
| 5,937,341 A * | 8/1999 | Suominen | .............. | H03D 3/007 |
| | | | | 375/324 |
| 7,006,583 B2 * | 2/2006 | Ho | ................... | H04B 1/71637 |
| | | | | 375/136 |
| 7,259,643 B2 | 8/2007 | Son et al. | | |
| 7,400,212 B1 * | 7/2008 | Vishinsky | ............. | H03F 1/3211 |
| | | | | 327/552 |
| 7,606,549 B2 * | 10/2009 | Suominen | .............. | H03D 3/007 |
| | | | | 455/258 |
| 7,970,811 B2 * | 6/2011 | Shen | ................. | H03H 21/0001 |
| | | | | 708/819 |
| 8,107,917 B2 | 1/2012 | Russell et al. | | |
| 8,150,362 B2 | 4/2012 | Waight et al. | | |
| 8,207,798 B1 | 6/2012 | Wright | | |
| 8,779,832 B2 * | 7/2014 | Gupta | ................... | G06G 7/18 |
| | | | | 327/339 |
| 8,866,531 B2 * | 10/2014 | Gupta | ................... | H03F 3/19 |
| | | | | 327/336 |
| 2003/0207679 A1 * | 11/2003 | Kaczynski | ......... | H03H 11/0433 |
| | | | | 455/339 |
| 2004/0196085 A1 * | 10/2004 | Shen | ................... | H03H 15/00 |
| | | | | 327/277 |
| 2006/0106317 A1 * | 5/2006 | McConnell | .......... | A61B 5/0059 |
| | | | | 600/476 |
| 2007/0156799 A1 * | 7/2007 | Gilbert | .................. | H03H 17/06 |
| | | | | 708/300 |
| 2007/0182481 A1 * | 8/2007 | Wu | ........................ | H03F 3/602 |
| | | | | 330/54 |
| 2007/0211837 A1 * | 9/2007 | Zipper | .................... | H04B 1/28 |
| | | | | 375/350 |
| 2008/0218273 A1 | 9/2008 | Uehara et al. | | |
| 2008/0318536 A1 * | 12/2008 | Suominen | .............. | H03D 3/007 |
| | | | | 455/150.1 |
| 2009/0322418 A1 * | 12/2009 | Burke | .................. | H03H 15/023 |
| | | | | 327/552 |
| 2010/0054369 A1 * | 3/2010 | Moon | ................ | H04L 25/0288 |
| | | | | 375/340 |
| 2010/0295634 A1 | 11/2010 | Akale | | |
| 2010/0328546 A1 * | 12/2010 | Rafi | ......................... | H03J 3/06 |
| | | | | 348/731 |
| 2011/0075049 A1 * | 3/2011 | Ahluwalia | ........... | H04B 1/0007 |
| | | | | 348/731 |
| 2012/0293233 A1 * | 11/2012 | Gupta | ........................ | H03F 3/19 |
| | | | | 327/339 |
| 2013/0106487 A1 * | 5/2013 | Gupta | ...................... | G06G 7/18 |
| | | | | 327/339 |

\* cited by examiner

VARIABLE BANDWIDTH FILTER

RELATED APPLICATIONS

This application claims priority to U.S. Provisional Patent Application No. 62/040,343, filed on Aug. 21, 2014, and entitled "MONOLITHIC, BANDWIDTH-TUNABLE INTERMEDIATE FREQUENCY FILTER FOR RANGE-OPTIMAL PULSED RADAR APPLICATIONS". This application also claims priority to U.S. Provisional Patent Application No. 62/040,356, filed on Aug. 21, 2014, and entitled "ANTIALIAS FILTER". The entireties of these applications are incorporated herein by reference.

STATEMENT OF GOVERNMENTAL INTEREST

This invention was developed under Contract DE-AC04-94AL85000 between Sandia Corporation and the U.S. Department of Energy. The U.S. Government has certain rights in this invention.

BACKGROUND

There are a variety of applications for radar systems, including use in connection with automated navigation (e.g. guiding of an airborne object, guiding of a vehicle, etc.). Generally, a radar system includes a transmitter and a receiver, where the transmitter is configured to emit a radar signal and the receiver is configured to receive at least a portion of the radar signal responsive to the radar signal reflecting from a target. Based upon time of flight of the radar signal, the radar system can identify a distance between the radar system and the target (as well as a rate of change of the distance between the radar system and the target). Additionally, a radar system can be used to track objects, identify objects, search for movement, search for a particular type of object, etc.

A pulsed radar system utilizes pulse timing techniques to, for example, determine the range to a target. In operation, the transmitter emits pulses of radio energy, each of which has pulse width (in time). It has been found that radar system performance increases if the pulse width is a function of a distance between the radar system and the target, where the further the target is away from the radar system, the larger the pulse width.

On the radar receiver, conventionally, filters are employed to enhance a signal-to-noise ratio (SNR) of a detected radar pulse. Typically, the bandwidth of the filter (the size of the passband) is designed to correspond to the narrowest pulse that can be emitted by the radar transmitter. This is suboptimal, however, as unwanted noise may pass through the filter when the radar transmitter emits pulses with larger widths.

SUMMARY

The following is a brief summary of subject matter that is described in greater detail herein. This summary is not intended to be limiting as to the scope of the claims.

Described herein are various technologies pertaining to a variable bandwidth filter. The filter can be formed on a complementary metal-oxide semiconductor (CMOS) chip, and is configured to filter analog signals. In an example, a radar receiver can include the filter, and the passband of the filter can be dynamically tuned as a function of width of pulses emitted by a radar transmitter. With more specificity, bandwidth of the passband of the filter can decrease as pulse width increases, while bandwidth of the passband of the filter can increase as pulse width decreases. The filter can include a finite impulse response (FIR) filter, wherein the FIR filter includes tunable transconductors (which are tunable in transconductance gain).

While the above description references use of the filter in a pulsed radar system, it is to be understood that the filter described herein can be employed in other types of radar systems. For example, the filter is well-suited for use in a continuous wave radar system. In another example, the filter is well-suited for use in a radar system whose bandwidth is desirably a function of carrier modulation (e.g., spread spectrum, frequency modulation ramp, etc.) within a transmitted signal. The filter may further be well-suited for use in communications systems other than radar systems, such as mobile telephones, satellite systems, and the like.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
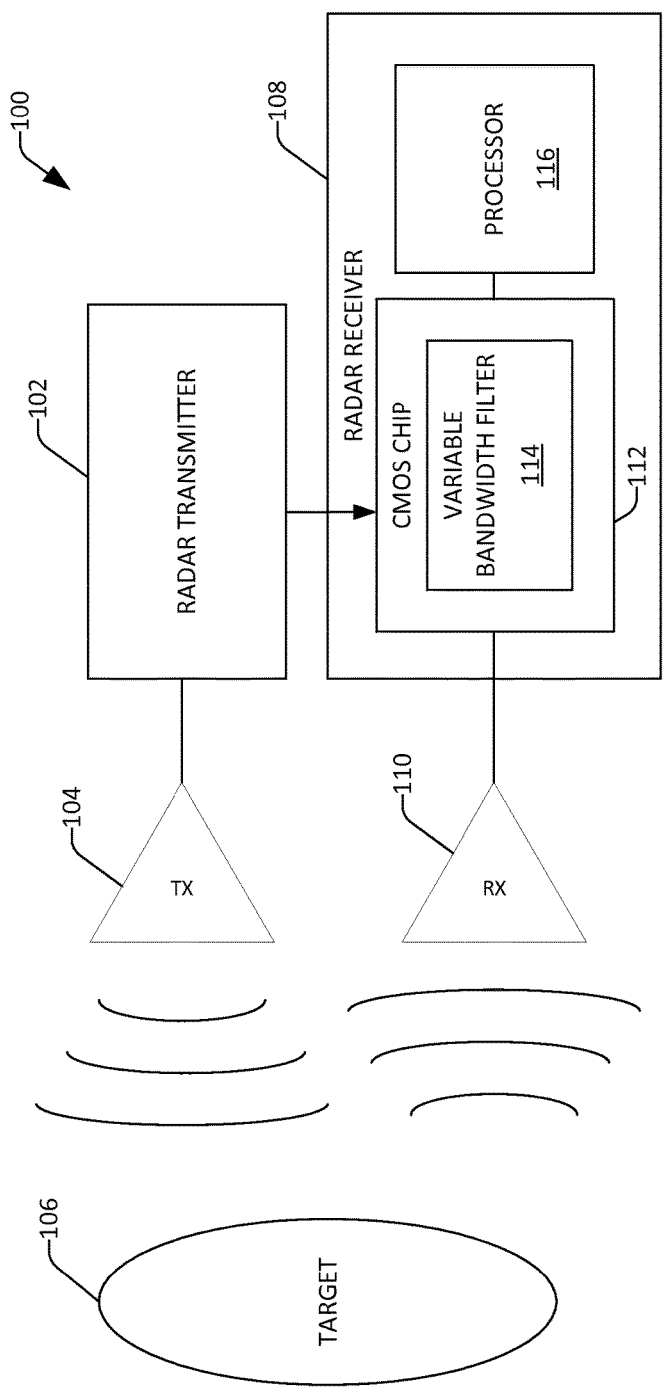
FIG. 1 is a functional block diagram of an exemplary pulsed Doppler radar system.

Various technologies pertaining to signal processing generally, and pulsed radar specifically, are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

Described herein are various technologies pertaining to signal processing. With more particularity, described herein are technologies relating to a radar receiver that comprises a filter with a tunable passband, wherein the filter passband is a function of a width (in time) of pulses emitted by a radar transmitter. With reference now to FIG. 1, an exemplary radar system 100 is illustrated. The radar system 100 includes a radar transmitter 102, which comprises a transmit antenna 104. The transmit antenna 104 is caused to emit pulses (in time) of radio energy. While not shown, one skilled in the art will recognize that the radar receiver 108 may include or be coupled to: an energy source (e.g., a battery or other suitable energy source); a signal generator, such as a digital signal processor (DSP); one or more digital-to-analog converters (DACs); one or more amplifiers; and other electronics that are suitable to cause the transmit antenna 104 to transmit pulses of radio energy, where the pulses have a desired (and configurable) pulse width (in time) and a desired (and configurable) amount of time between emitted pulses. In a non-limiting example, the radio energy can have a frequency of about 20 MHz, the pulse width can be between about 100 and about 500 ns, and pulses can be emitted each microsecond. As shown in FIG. 1, radio energy emitted by the transmit antenna 104 impacts a target 106, reflects from the target 106, and travels back in the direction of the radar system 100.

The radar system 100 further comprises a radar receiver 108, which comprises a receive antenna 110. The receive antenna 110 receives the radio energy reflected from the target 106, and converts such energy into an electrical signal. The radar receiver 108 includes at least one complementary metal oxide semiconductor (CMOS) chip 112, which has various (analog) electronic componentry formed thereon. The CMOS chip 112 includes a variable bandwidth filter 114, which is configured to filter the electrical signal (or a derivative thereof) output by the receive antenna 110 to generate a passband signal. As indicated by its name, the variable bandwidth filter 114 may be a bandpass filter that has a programmable passband, where the passband is set as a function of the width of the pulses transmitted by the radar receiver 108. For instance, the variable bandwidth filter 114 may have a center frequency of 20 MHz (e.g., the frequency of the radar energy emitted by the radar transmitter 102), and can have a passband (centered about the center frequency) with a bandwidth that is a function of the width of the pulses of radar energy emitted by the radar transmitter 102. With still more specificity, as the width of the pulses emitted by the radar transmitter 102 increase, the bandwidth of the passband of the variable bandwidth filter 114 can decrease. The variable bandwidth filter 114 has numerous components, which will be described in greater detail below.

The radar receiver 108 also includes a processor 116 that is in communication with the variable bandwidth filter 114, wherein the processor 116 can process a digital signal that is a derivative of the passband signal output by the variable bandwidth filter 114. For example, while not shown, the radar receiver 108 can additionally include one or more amplifiers and/or an analog-to-digital converter (ADC) disposed between the variable bandwidth filter 114 and the processor 116. The processor 116 can output data that is indicative of location and/or movement of the target 106 relative to the radar system 100 based upon the passband signal output by the variable bandwidth filter 114.

In operation, the radar transmitter 102 can be configured to emit radio energy with pulse widths that are a function of a computed or estimated distance between the radar system 100 and the target 106. More specifically, when the target 106 is determined to be relatively far away from the radar system 100, the radar transmitter 102 can cause the transmit antenna 104 to emit radar pulses that are relatively wide (e.g., 500 ns pulse width). When the target 106 is detected as being relatively close to the radar transmitter 102, to increase resolution, the radar transmitter 102 can be configured to cause the transmit antenna 104 to transmit radar pulses that are relatively narrow (e.g., 100 ns pulse width). The radar transmitter 102 outputs a signal that is indicative of width of pulses being transmitted by the transmit antenna 104, and the radar receiver 108 receives such signal. The radar receiver 108 programs the variable bandwidth filter 114 to have a passband that is based upon the width of the pulses being transmitted by the radar transmitter 102. Accordingly, as width of the pulses transmitted by the transmitter 102 changes, the passband of the variable bandwidth filter 114 likewise changes.

Figure 2:
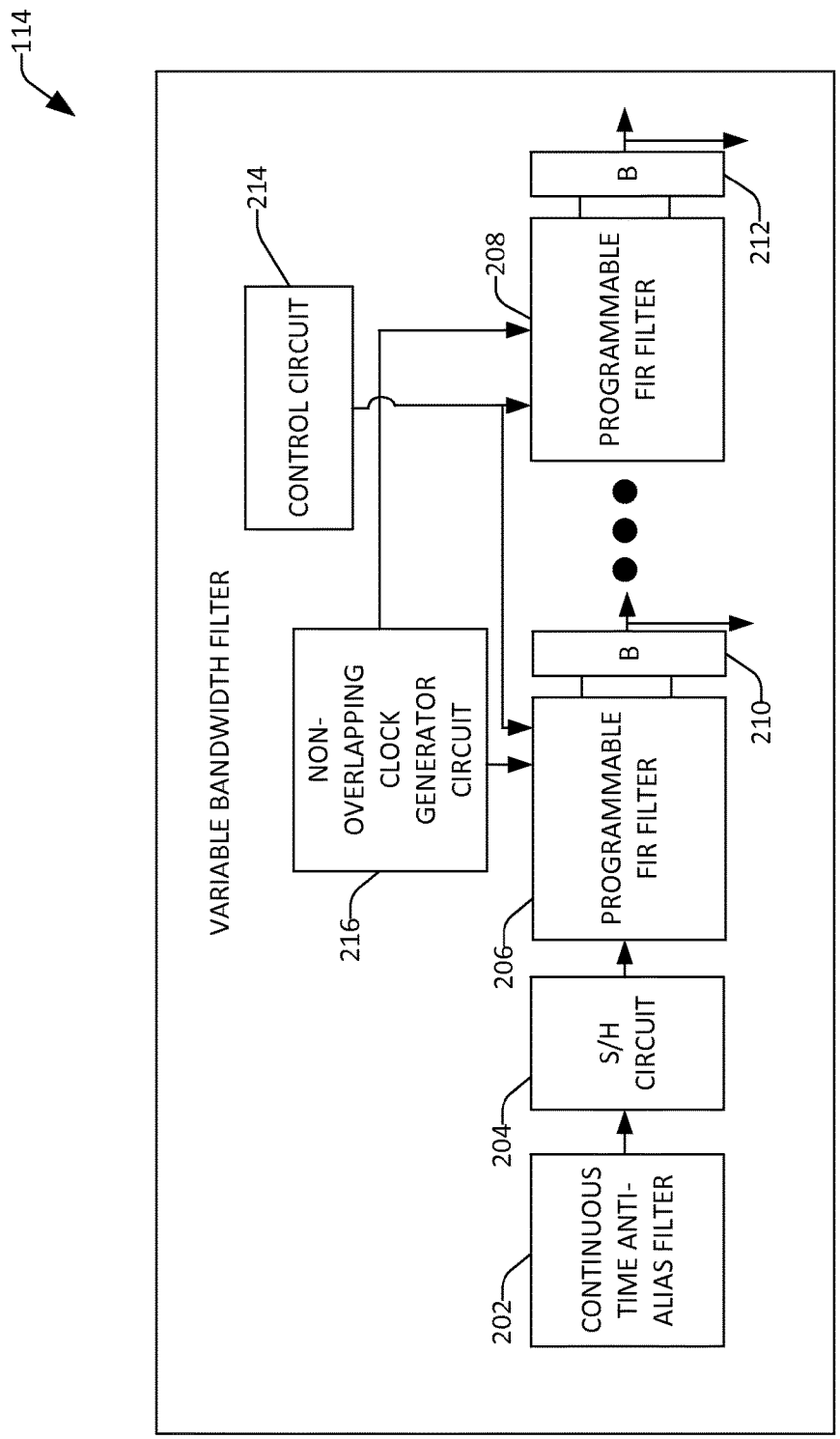
FIG. 2 is a functional block diagram of an exemplary variable bandwidth filter.

Now referring to FIG. 2, a functional block diagram of the variable bandwidth filter 114 is illustrated. While FIG. 1 illustrates the variable bandwidth filter 114 being formed on a single CMOS chip, it is to be understood that componentry of the variable bandwidth filter 114 may be formed on separate CMOS chips. Accordingly, one component of the variable bandwidth filter 114 may be formed on a first CMOS chip, while another component of the variable bandwidth filter 114 may be formed on a second CMOS chip.

The variable bandwidth filter 114 comprises a continuous-time anti-alias filter 202 (referred to hereafter as the anti-alias filter 202). Generally, the anti-alias filter 202 receives an analog signal, wherein the analog signal can be output by the receive antenna 110 or may be a derivative of a signal output by the receive antenna 110. The anti-alias filter 202 acts as a low pass or a band-pass filter, attenuating high frequency components from the analog signal. An output of the anti-alias filter 202 is referred to herein as a filtered signal.

The variable bandwidth filter 114 also includes a sample and hold circuit 204 that receives the filtered signal output by the anti-alias filter 202. The sample and hold circuit 204 creates a discrete time signal based upon the filtered signal. In other words, the sample and hold circuit 204 discretizes the filtered analog signal output by the anti-alias filter 202.

The variable bandwidth filter 114 further includes a plurality of programmable finite impulse response (FIR) filters 206-208, each of which has or has coupled thereto a corresponding buffer and multiplexor 210-212. While the variable bandwidth filter 114 is illustrated as including several programmable FIR filters 206-208, it is to be understood that the variable bandwidth filter 114 may include a single programmable FIR filter. The programmable FIR filters 206-208 are connected together in series to improve performance of the variable bandwidth filter 114. As will be described in greater detail below, each of the programmable FIR filters 206-208 can be a multi-tap filter, wherein outputs at the taps can be multiplexed and buffered by the multiplexers and buffers 210-212. The passbands of the programmable FIR filters 206-208 are programmed based upon the widths of the pulses emitted by the radar transmitter 102. Thus, the programmable FIR filter 206 receives the discretized signal from the sample and hold circuit 204, and outputs a first passband signal, wherein passband of the programmable FIR filter 206 is programmed as a function of the aforementioned pulse widths of the transmitted radio energy. The second programmable FIR filter 208 receives a passband signal from an immediately preceding programmable FIR filter in the series of programmable FIR filters 206-208, and acts to refine the filtering of such signal. Further, as shown, output of each of the programmable FIR filters 206-208 can be obtained independently.

The variable bandwidth filter 114 further includes a control circuit 214 that is configured to generate control signals, where the control signals are configured to program the programmable FIR filters 206-208 to have a passband which is a function of the width of pulses emitted by the radar transmitter 102.

Finally, the variable bandwidth filter 114 comprises a non-overlapping clock generator circuit 216 (hereinafter referred to as clock circuit 216), which is configured to generate numerous non-overlapping clock signals as a function of, or based upon, a reference clock signal. The purpose of clock circuit 216 is to generate a certain number of "on" signals over a window of time (with a desired duration), where a time duration between consecutive "on" signals is as desired (e.g., as small as possible). As will be described in greater detail below, these non-overlapping clock signals are employed to control switches in the programmable FIR filters 206-208, where only one switch (per FIR filter) is to be closed at any given point in time. The output of the variable bandwidth filter 114 is a filtered analog signal, where the filtered analog signal has a desired center frequency and a passband that is a function of the width of the pulses emitted by the radar transmitter 102. The componentry of the variable bandwidth filter 114 will now be described in greater detail.

Figures 3A, 3B, 3C:
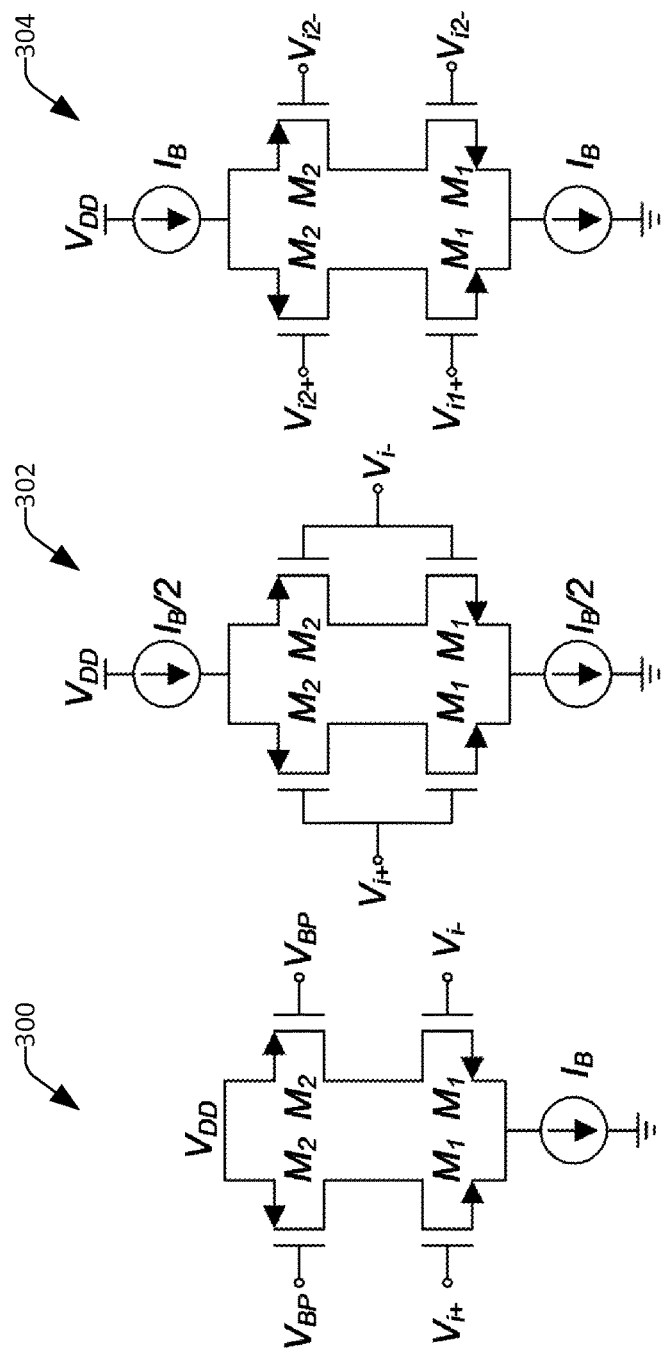
FIGS. 3A-3C illustrate schematics of exemplary transconductor cells.

With reference now to FIG. 3A-3C, schematics of exemplary circuits 300-304 that may be included in the anti-alias filter 202 are illustrated. As digital signal processors (DSPs) have become faster and more power efficient, more analog signals are being processed in the digital domain through use of analog-to-digital converters (ADCs). Accordingly, it is desirable to have noise and undesired frequency components in the analog signal accounted for prior to conversion to digital. The anti-alias filter 202 is employed to reduce effects of signals that, if present, would fold back into the frequency band of interest due to the sampling effect.

The circuit 300 shown in FIG. 3A illustrates a conventional transconductor used in $G_m$-C filter realizations. The circuit 300 comprises an N-type differential pair, which includes transistors $M_1$. The circuit 300 also includes P-type transistors $M_2$. The differential pair realizes the voltage-to-current conversion, while the P-type transistors are used as current sources to bias the arms of the differential pair. Even if the differential pair is quite efficient, the power dissipated by the P-type transistors is not used for signal processing, thereby reducing power efficiency of the circuit 300.

FIG. 3B illustrates another exemplary circuit 302, which illustrates a complementary differential pair-based transconductor. The circuit 302 includes two differential pairs (formed of both N-type and P-type transistors), wherein the differential pairs use the same bias current. Sharing of the bias current increases the transconductance of the amplifiers to $G_m = g_{mN} + g_{mP}$. For the same power consumption, the signal-to-noise ratio (SNR) will increase by a factor of $1 + g_{mN}/g_{mP}$ compared to the SNR corresponding to the circuit 300 shown in FIG. 3A.

FIG. 3C illustrates another exemplary circuit 304, which is based upon the dual-differential pair design of the circuit 302. The topology of the circuit 304 uses the same amount of current to produce the desired transconductance as the conventional differential pair shown in the circuit 300. The circuit 304 includes the N-type transistors $M_1$ and the P-type transistors $M_2$, where the P-type transistors $M_2$ are biased to produce a second transconductance, which can be used in the biquad filter.

Table 1, set forth below, depicts various performance metrics of the three circuits 300-304 represented in FIGS. 3A-3C. As illustrated in Table 1 below, the circuit 304 shown in FIG. 3C (referred to as having a current re-use topology) maintains the same power and noise density performance as the dual differential pairs, but with less input capacitance.

TABLE 1

| Metric | Circuit 300 | Circuit 302 | Circuit 304 |
| --- | --- | --- | --- |
| Transconductance/OTA | $g_{m1}$ | $g_{m1}\left(1 + \dfrac{\beta_P}{\beta_n}\right)$ | $g_{m1}$ |
| Bias Current | $2I_B$ | $I_B$ | $2I_B$ |
| Noise/OTA | $4kTg_{m1}\left(1 + \dfrac{g_{m2}}{g_{m1}}\right)$ | $4kTg_{m1}$ | $4kTg_{m1}$ |
| Input Capacitance | $C_{gs1}$ | $C_{gs1}\left(\dfrac{1 + \dfrac{\mu_n}{\mu_p}}{2}\right)$ | $C_{gs1}$ |
| DC gain (OTA) | $\dfrac{g_{m1}}{g_{01} + g_{02}}$ | $\cong \dfrac{g_{m1}}{g_{01}}$ | $\dfrac{g_{m1}}{g_{01}}$ |
| Biquad Power | $\cong 4I_B$ | $\cong 2I_B$ | $\cong 2I_B$ |

Figure 4:
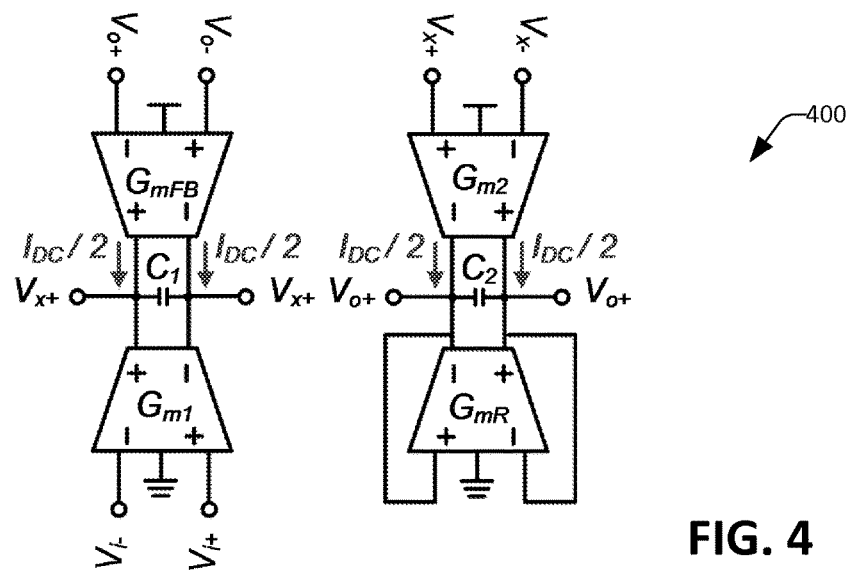
FIG. 4 depicts a schematic of an exemplary second-order biquad filter.

Turning to FIG. 4, a schematic of a circuit 400 that has the current re-use architecture depicted in the circuit 304 of FIG. 3C is illustrated. The circuit 400 represents a current reused $G_m$-C biquad implementation. The anti-alias filter 202 can comprise a plurality of such circuits, cascaded one after another. The biquad implementation shown in FIG. 4 includes OTAs $G_{m1}$, $G_{m2}$, $G_{mFB}$, and $G_{mR}$, as well as capacitors $C_1$ and $C_2$. The OTAs are arranged to re-use DC current to bias two of the OTAs at the same time. In operation, voltage $V_i$ is input into $G_{m1}$, which then injects current into capacitor $C_1$, thereby charging $C_1$. Voltage $V_x$ created at $C_1$ is fed to $G_{m2}$, which injects current onto capacitor $C_2$, thereby charging $C_2$. $G_{mR}$ is a feedback element whose inputs are coupled to its outputs, thereby acting as a resistor in parallel with capacitor $C_2$. Accordingly, $G_{mR}$ can be configured for a desired Q factor of the anti-alias filter 202.

$G_{mFB}$ and $G_{m1}$ are configured to set a desired gain of the filter 202, and capacitors $C_1$ and $C_2$, as well as $G_{m2}$ and $G_{mR}$ are configured to set the desired cutoff frequency of the filter. The circuit 400 is associated with reduction in power when compared with conventional circuits having a biquad architecture, and results in reduced noise in the output signal. Still further, the circuit 400 requires less area on-chip when compared to conventional approaches, and allows for relatively high frequency operation. Additionally, in a fully differential design, the topology of the circuit 400 needs only two common mode feedback circuits, as opposed to four in the conventional biquad, thereby further reducing power consumption.

Figure 5:
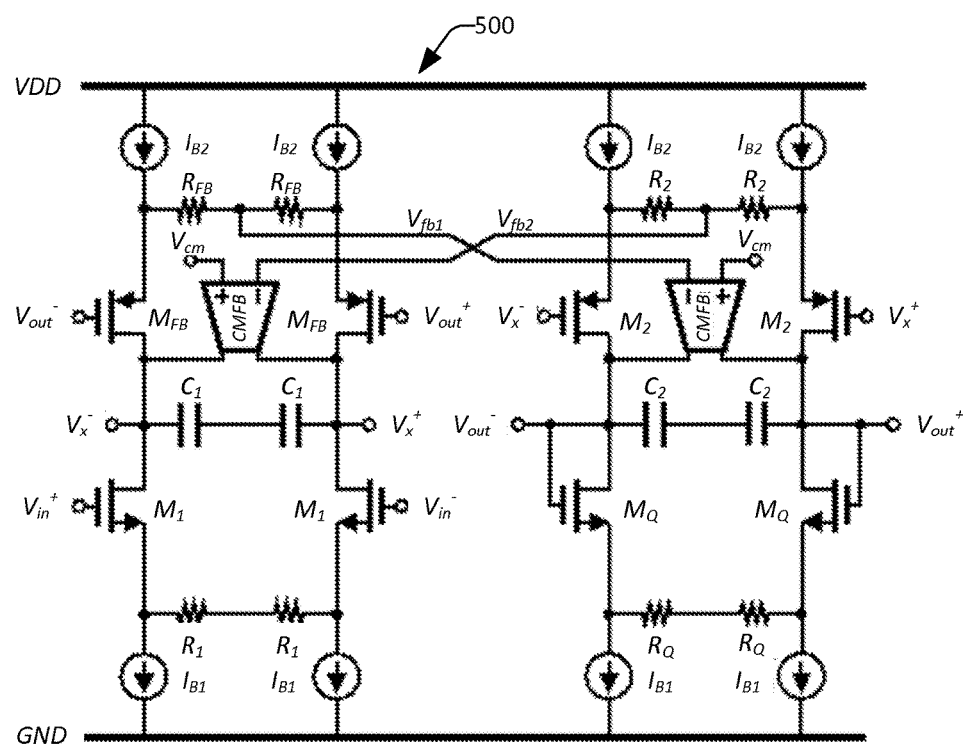
FIG. 5 depicts another schematic of the exemplary second-order biquad filter shown in FIG. 4.

With reference to FIG. 5, a schematic of a circuit 500 is presented, wherein the circuit 500 is an exemplary implementation the biquad filter shown in FIG. 4. Each of the OTAs is implemented through use of a differential pair with source degeneration. Since linearity is not critical for the biquad filter, no additional linearization is shown, as linearization likely would increase power consumption and hinder noise performance. The circuit 500 includes the NMOS OTA $G_{m1}$, which includes an N-type differential pair of transistors $M_1$ as well as resistors $R_1$. The circuit 500 also includes the PMOS OTA $G_{mFB}$, which comprises a P-type differential pair of transistors $M_{FB}$ and resistors $R_{FB}$. $G_{m1}$ is biased with the P-type differential pair with source degeneration. The circuit 500 includes a split tail-current design to avoid encountering voltage drop across the source degeneration resistors ($R_{FB}$). The circuit 500 illustrates a full biquad filter, as the circuit 500 includes two of these differential pair sets, with the PMOS inputs receiving the output from the opposite set of differential pairs.

The circuit 500 also comprises two common mode feedback (CMFB) amplifiers. Each CMFB amplifier is noninvasive to the output, thus avoiding resistive loading that can reduce the gain of the OTAs and limit their bandwidth due to extra parasitic capacitances. The CMFB amplifiers take advantage that the common mode voltage information of each stage appears in the middle of the source degeneration of the PMOS differential pairs of the opposite stage. The reference voltage for the CMFB amplifier will be $V_{jbi}=V_{cm}+V_{gs}$.

The transfer function of the circuit 500 is equivalent to the classical biquad circuit implementation:

$$H(s) = \frac{\frac{g_{m1}}{g_{fb}}\left(\frac{g_{m2}g_{mfb}}{C_1 C_2}\right)}{s^2 + s\frac{g_{mQ}}{C_2} + \frac{g_{m2}g_{mfb}}{C_1 C_2}} \quad (1)$$

Figures 6A, 6B:
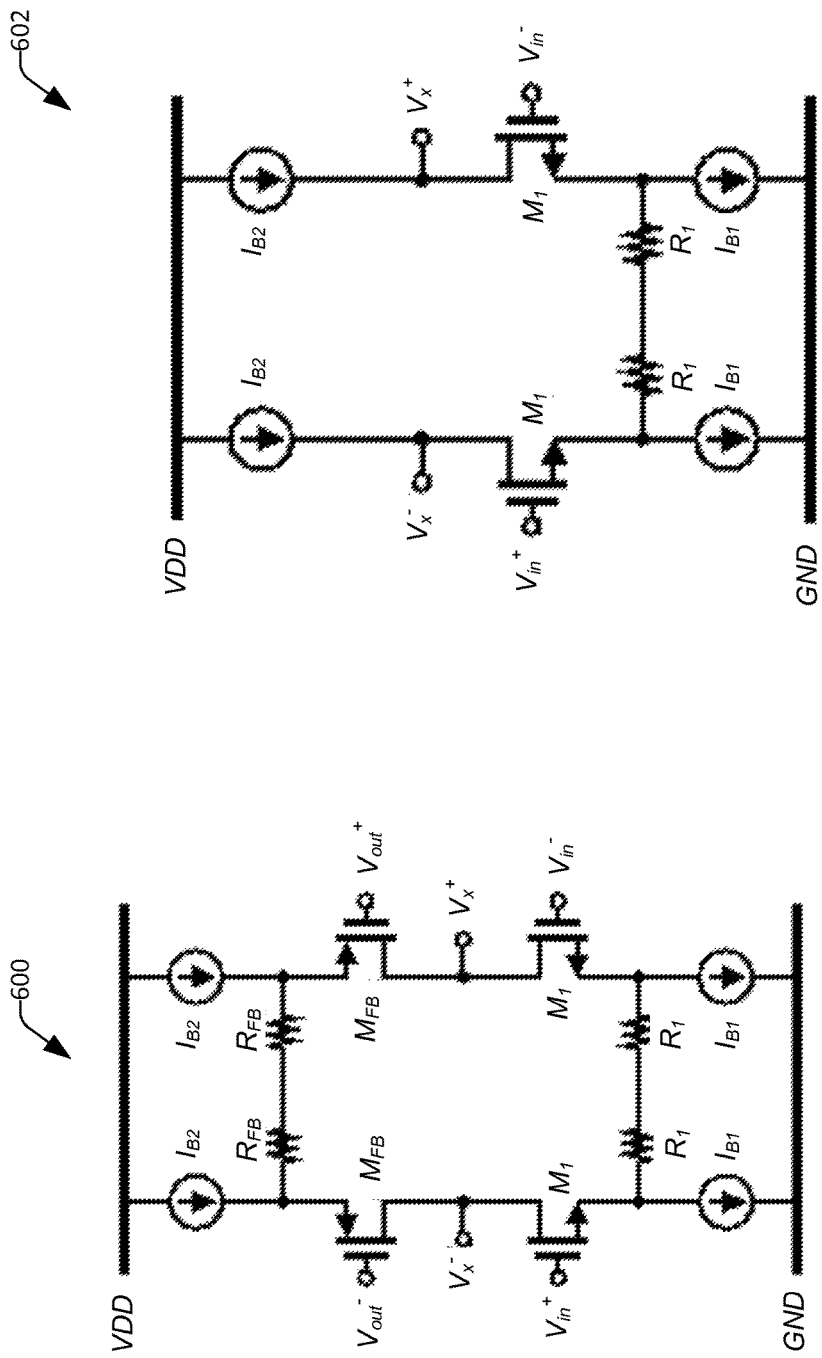
FIGS. 6A and 6B illustrate schematics of exemplary operational transconductance amplifiers.

The architecture of the circuit 500 has various advantages over conventional designs, where one of such benefits is reduced current consumption. FIG. 6A is a schematic of a circuit 600, which includes a pair of OTAs ($G_{m1}$ and $G_{mFB}$). The circuit 600 incorporates the current re-use topology of the circuit 500 shown in FIG. 5. In contrast, FIG. 6B is a schematic of a circuit 602 having a single OTA configured with a conventional OTA topology. Two of circuit 602 can be electrically coupled to implement the circuit 600. Benefits of the topology of the circuit 600 over the circuit 602 are clear, as in the circuit 600, the DC current from $G_{mFB}$ is used to bias $G_{m1}$. Compared with the traditional OTA, the implemented biquad will reduce the power consumption by approximately half compared to the conventional implementation, assuming that the bias current use for all the OTAs in the classic implementation are the same. Thus, the circuit 600 shown in FIG. 6A will be doubly efficient compared to the circuit 602 shown in FIG. 6B.

Additionally, a primary reason for using $G_m$-C filters instead of active-RC filters is their ability to operate at higher frequencies. Thus, the technology described herein not only reduces the power consumption (by reducing the number of current sources by half), it also increases the maximum achievable speed that can be obtained. When the integrating capacitors are reduced to being only the circuit's parasitic capacitances, the maximum frequency of operation is increased. If the transfer function is implemented with only the parasitic capacitances, the following can be obtained:

$$H(s) = \frac{\frac{g_{m1}}{g_{mfb}}\left(\frac{g_{m2}g_{mfb}}{C_{par1,x}C_{par2,x}}\right)}{s^2 + s\frac{g_{mQ}}{C_{par1,x}} + \frac{g_{m2}g_{mfb}}{C_{par1,x}C_{par2,x}}}$$

$$C_{par1,C} = C_{par,M1} + C_{par,Mfb} + 2C_{par,Mbias}$$

$$C_{par2,C} = C_{par,M2} + C_{par,MQ} + 2C_{par,Mbias}$$

$$C_{par1,N} = C_{par,M1} + C_{par,Mfb}$$

$$C_{par2,N} = C_{par,M2} + C_{par,MQ}$$

The parasitic capacitors for the conventional circuit are given by $C_{par1,C}$ and $C_{par2,C}$, while the parasitic capacitors for the current-reuse based biquad are given by $C_{par1,N}$ and $C_{par2,N}$.

Still further, noise performance of a filter is important since the SNR for in-band signals may be poor at the input and any reduction would be detrimental. It is known that the reduction of input referred noise comes with the penalty of more power consumption and area. The implementations, described herein, reduce the input referred noise without the need of extra power or increasing the area.

Figure 7:
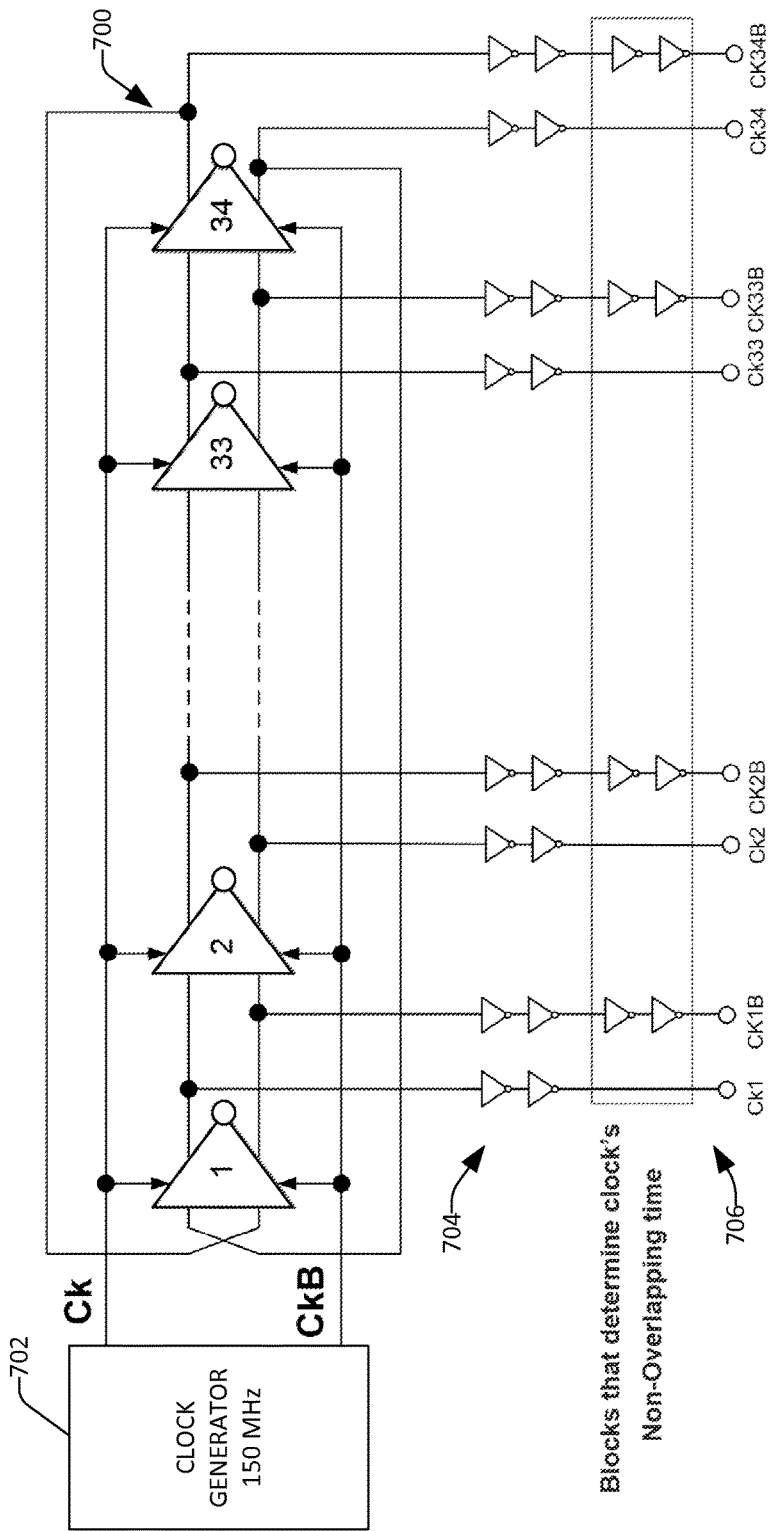
FIG. 7 illustrates a schematic of an exemplary clocking circuit.

Information pertaining to the clock generator circuit 216 is now set forth. FIG. 7 is a schematic that illustrates an exemplary circuit 700 that implements the clock generator circuit 216. The circuit includes a ring oscillator (RO) with an additional set of switches that are controlled by a reference clock 702. In the exemplary circuit 700, the RO comprises 34 inverter stages, which are configured to generate 34 non-overlapping clock signals. The number of inverter stages in the RO is selected as a function of a number of non-overlapping clock signals that are to be generated. As shown, the output of the 34$^{th}$ inverter is provided as input to the first inverter.

The output signal at each inverter stage is the frequency of the reference clock signal divided by the number of inverters in the RO. In an example, when the reference clock 702 emits a clock signal with a frequency of 150 MHz, the signal output by each inverter will be 150/34 MHz. This is illustrated in a timing diagram 800 shown in FIG. 8, where the reference clock 802 outputs the CLK clock signal at 150 MHz, and the frequency of CK1 and CK1B are approximately 4.4 MHz.

Figure 8:
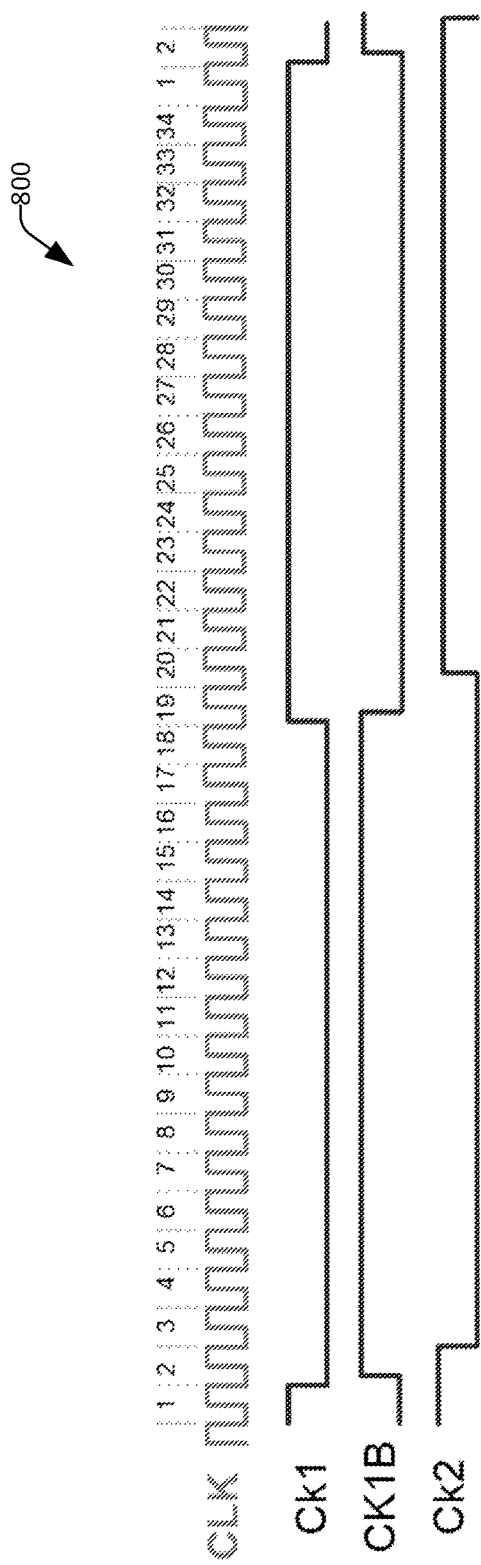
FIGS. 8 and 9 depict timing diagrams that illustrate timing of clock signals output by the exemplary clocking circuit.

The operation of the circuit 700 is illustrated in the timing diagram 800 shown in FIG. 8. CK1 and CK2 are outputs of inverter stages one and two, respectively, and will each be delayed by one clock cycle of the reference clock 702 from the previous inverter in the RO. Continuing, CK3 is delayed from CK2 by one clock cycle of the clock signal generated by the reference clock 702. The circuit 700 also includes inverters 704, which act to buffer the signals. The circuit 700 also comprises inverters 706 that control the "off" time of the signal output by the clock circuit 216 (e.g., the non-overlapping time between pulses).

As will be shown below, current is injected onto capacitors in the FIR filters 206-208 via separate switches. If two switches were closed at the same time, leakage would occur between two or more capacitors; accordingly, the clock signals emitted by the circuit 216 need to be non-overlapping. The circuit 700 depicts a power-efficient mechanism for generating non-overlapping clock phases, as a single reference clock can be employed.

Returning again to the timing diagram shown in FIG. 8, signal CK1 and CK1B are output by the first inverter stage, where CK1B is the inverse of CK1, and where CK1B is slightly delayed from CK1 due to the two additional inverters in the inverters 706.

Figure 9:
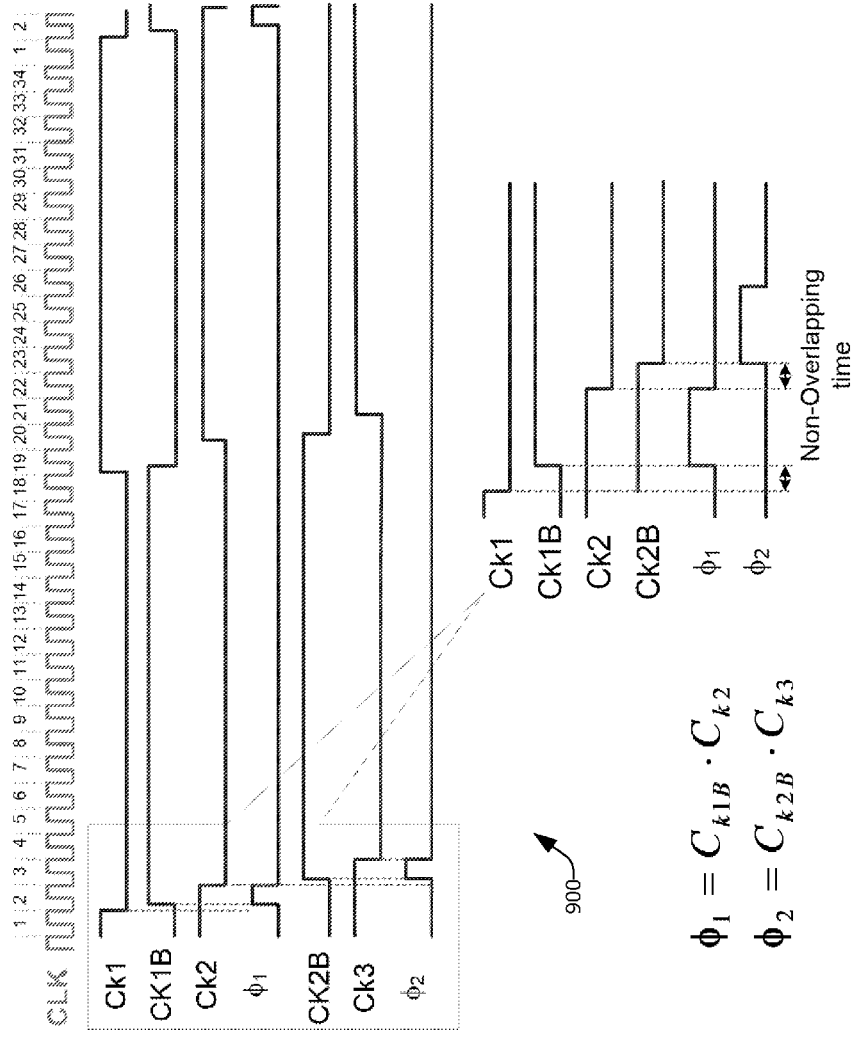

Referring to FIG. 9, another timing diagram 900 pertaining to the circuit 700 is illustrated. As illustrated in the timing diagram 900, CK2 will be slightly out of phase from CK1. Running CK1B and CK2 through an AND gate forms a φ1 signal. Likewise, running CK2B and CK3 through an AND gate forms a φ2 signal, which is a pulsed signal slightly delayed from φ1. With reference to φ1 and φ2, such pulses will be high approximately 6.7 ns (1/150 MHz) and repeat with a frequency of 150/34 MHz, and the pulses will be non-overlapping in time with a delay therebetween equivalent to the time delay introduced by two inverters.

Figure 10:
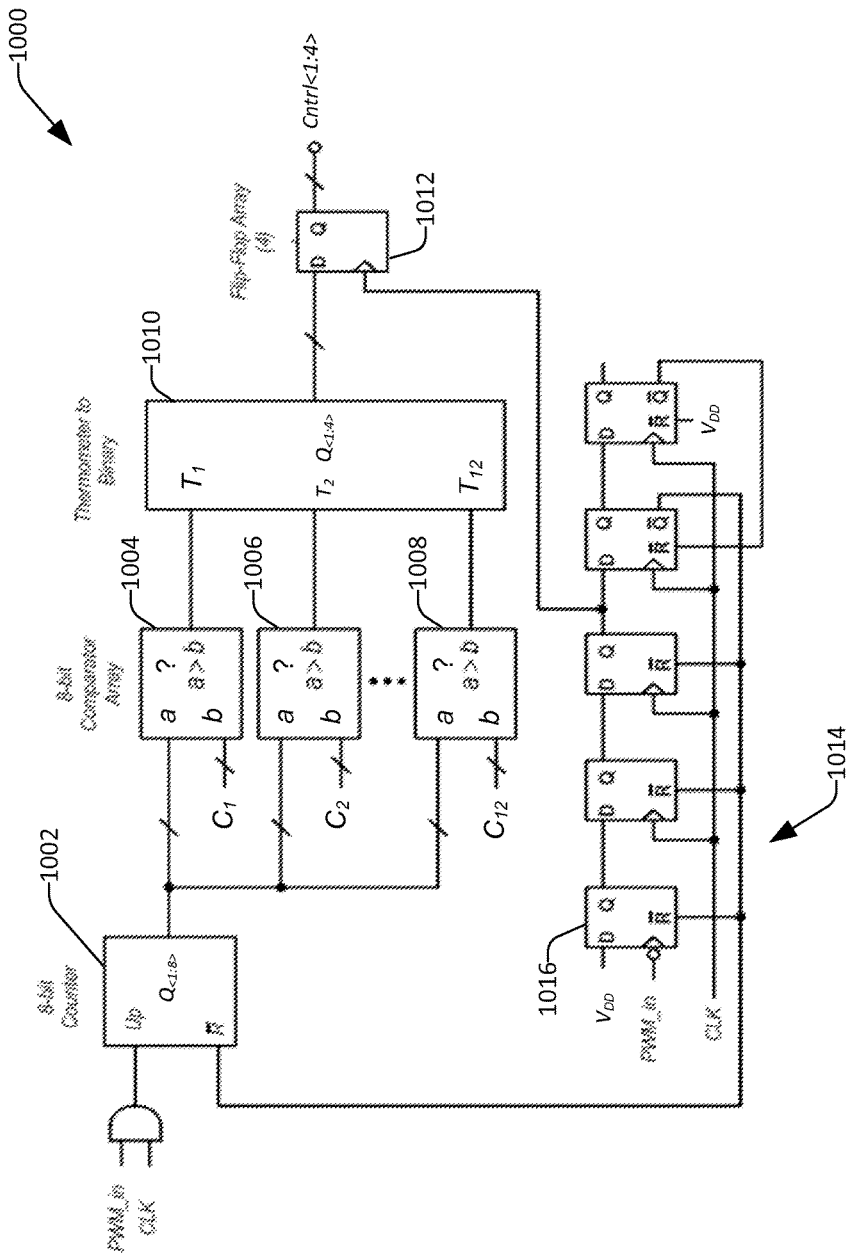
FIG. 10 is a schematic of an exemplary control circuit that transmits control signals to a variable bandwidth filter.

With reference to FIG. 10, a schematic of an exemplary circuit 1000 is illustrated, wherein the circuit 1000 is an exemplary implementation of the control circuit 214. Summarily, the control circuit 214 acts to compare the pulse emitted by the radar transmitter 102 with a clock signal of much higher frequency, where the number of rising edges of the clock signal that can fit inside the pulse signal will provide an estimate of the pulse width. As the clock signal is not synchronized with the emitted pulse, the number of rising edges in of the clock signal, when compared to the width of the pulse, may be one less than the maximum number of rising edges that can fit in the width of the pulse. A table can then be used to map pulse width to a desired bandwidth of the passband of the programmable FIR filters 206-208. The circuit 1000 shown in FIG. 10 comprises an 8-bit counter, which can increase a count by one for every rising clock edge. A reset of the 8-bit counter can reset the output to zero. The circuit 1000 further includes a plurality of comparators 1004-1008, where output of the 8-bit counter can be passed through the plurality of comparators 1004-1008. The number of comparators defines the number of bandwidth options in the tunable FIR filter.

The circuit 1000 also includes a thermometer to binary converter 1010, which produces a code that maps the pulse width (determined by the comparators 1004-1008) to the required passband. The output of such converter 1010 is latched and held by a flip-flop array 1012 at the required instant.

The circuit 1200 also includes a counter circuit 1014, which includes a plurality of flip-flops. When an input pulse to a first flip-flop 1016 in the counter circuit 1014 has a falling edge, the first flip-flop generates a logic 1 at the output, which is then delayed for two clock cycles. This allows for delays in the combinational logic used to implement the comparators 1004-1008 and thermometer to binary converter 1010. After latching, the flip-flops in the counter circuit 1014 are reset to zero.

Figure 11:
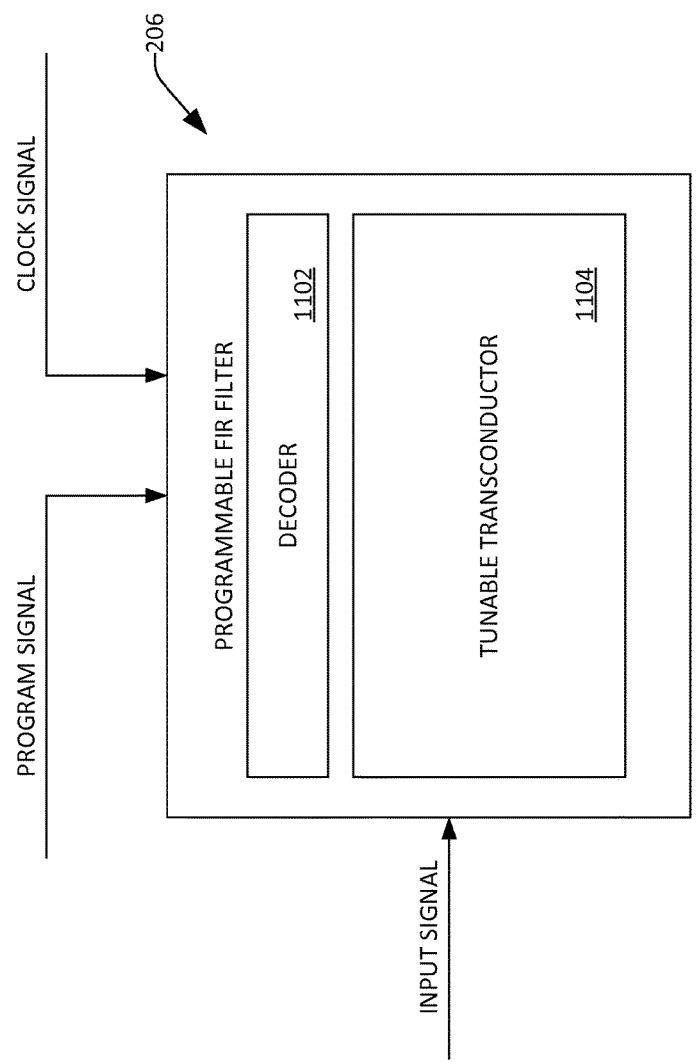
FIG. 11 is a functional block diagram of an exemplary programmable finite impulse response (FIR) filter.

Now referring to FIG. 11, a functional block diagram of the programmable FIR filter 206 is illustrated. The programmable FIR filter 206 includes a decoder circuit 1102, which receives a control signal from the control circuit 214 and programs the programmable FIR filter 206 responsive to decoding the control signal. The programmable FIR filter 206 additionally includes a tunable transconductor 1104, which is tunable in its gain. As will be described in greater detail below, the programmable FIR filter 206 additionally receives clock signals from the clock generator circuit 216, where switches of the programmable FIR filter 206 are controlled as a function of such clock signals.

In modern wireless systems, there is an increased push to move as much signal processing of received signals into the digital domain as possible. Prior to the digitization of a received waveform by an ADC, signals are typically filtered to help minimize noise, remove blockers, and avoid aliasing effects. FIR filters are used in a wide range of applications, which include WLAN and cellular receivers, frequency synthesizers, frequency down-conversion, software-defined radio, line equalizers, etc. FIR topologies, however, have not been used in radar systems to filter received radar pulses. As described above, in a pulsed Doppler radar transceiver, RF pulses are transmitted and the Doppler-shifted echo signal is returned and processed by the receiver. In a pulsed Doppler radar system, the system measures the range and velocity of a target by detecting the transmit time and Doppler shift of a reflected RF modulated pulse.

In radar systems, the received signals are typically very weak, often much weaker than the surrounding noise levels, resulting in poor SNRs. In current applications, the matched filter has typically been implemented with SAW and BAW filters. The disadvantage of these filters is that they are bulky, untunable, and not temperature sensitive, and must be off-chip, which is expensive compared to on-chip solutions. Most previously reported FIR filters typically fall into one of two categories, and all use switched capacitor designs, which typically need one amplifier per tap, while the newer trend in research tends toward switched current techniques, which involve routing current through switches to charge and discharge capacitors to provide the filter function.

The programmable FIR filter 206 is an FIR bandpass matched filter design which, for example, can have a 1.5 to 15 MHz tunable bandwidth centered at 20 MHz, which can replace the SAW or BAW filters of conventional systems, while moving the filtering function on-chip, where it can be nearer to the receiver and DSP, reducing overall cost. The design of the FIR filter 206 described herein employs several taps (e.g., 128) realized by transconductors, switches, capacitors, and a plurality of non-overlapping clock phases (e.g., 34). The transconductors described herein are tunable, which allows them to realize various filter bandwidths without modifying the filter clock rate. The entire FIR filter architecture dissipates at approximately 450 mW and achieves attenuation greater than 50 dB at 5 MHz beyond the −3 dB frequency with a center frequency of 20 MHz.

FIR filters are process, voltage, and temperature variation tolerant, and usually can be scaled in frequency by scaling the clock frequency. Due to its simplicity, an FIR filter can typically be implemented at a much higher order than would be conceivable with $G_m$-C, active RC, and switched capacitor techniques. The discrete time FIR filter 206 can have a constant group delay, whose value only depends on the clock rate and number of taps. Generally, FIR filters can be described by the following equation:

$$H(z) = \sum_{n=0}^{N} \alpha_n z^{-n} \quad (2)$$

where N is the number of taps, $z = e^{j\omega T_{ck}}$, and $T_{ck}$ is the clock period. If the coefficients of (2) are symmetric, meaning $$\alpha_n = \alpha_{N-n}, 0 \leq n \leq N,$$

then the filter 206 will have linear phase, which provides a constant group delay across all options. For a pulsed Doppler radar filter, constant group delay will allow the received signal to pass the desired intermediate frequency pulse without causing timing distortion in the pulse shape.

When implementing an exemplary filter, the MATLAB digital filter toolbox was used to obtain the required order and coefficients needed for each desired bandwidth. The selected intermediate frequency (IF) was 20 MHz, with an overall sampling rate of 75 MHz. The bandwidth was tunable from approximately 1.5 MHz to 15 MHz. In an extreme case, filtered flat-band bandwidth over center frequency ratio can be as high as 75%. In order to obtain attenuation of −50 dB at 5 MHz beyond the passband, four identical 32-tap FIR filters were cascaded (e.g., the variable bandwidth filter 114 can include four programmable FIR filters). Since operation of the FIR filters 206-208, in this application, is discrete time in nature, the input is first sampled with the sample and hold circuit 204. The input to the filter 206 may be forced to remain constant during each clock cycle. Accordingly, the sample and hold circuit 204 can include a time interleaved sampling hold topology to provide a constant input throughout the entire clock cycle.

Figures 12A, 12B:
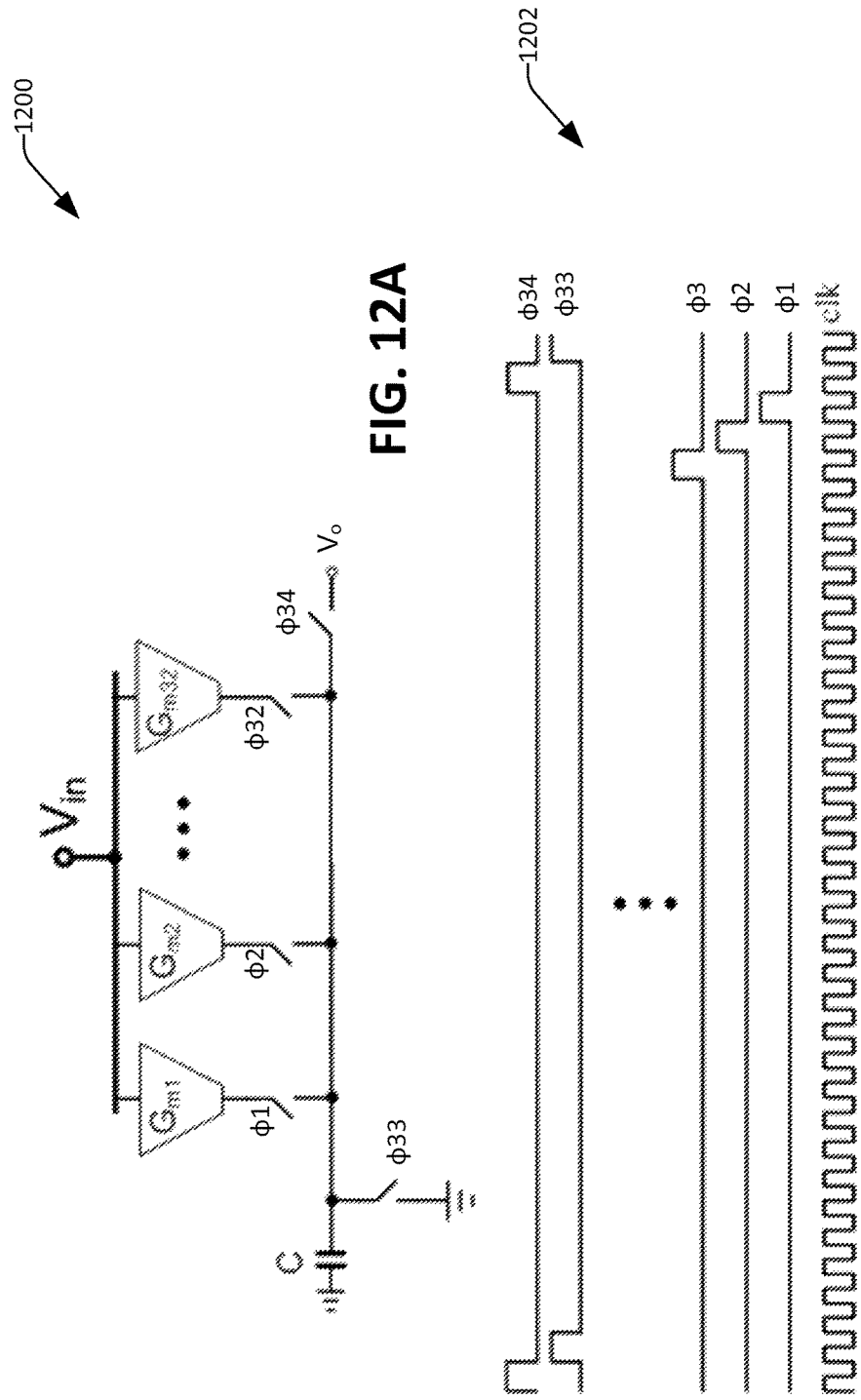
FIG. 12A is a schematic of an exemplary programmable FIR filter.
FIG. 12B is a timing diagram that depicts control signals transmitted to switches of the programmable FIR filter.

Now referring to FIG. 12A, a schematic of an exemplary FIR filter 1200 is presented, where the FIR filter 1200 comprises 32 transductors $G_{m1}$-$G_{m32}$, a capacitor C, and switches φ1-φ34. Referring to FIG. 12B, a timing diagram 1202 is presented, which illustrates non-overlapping clock signals controlling the switches φ1-φ34. The input voltage (as indicated above, constant during an entire clock cycle) is converted by the transconductors into a set of currents which, depending on the current clock phase, charge the capacitor C. The total charge injected onto the capacitor after 32 consecutive cycles, and measured at the end of the process during clock phase 34 is as follows:

$$Q_{C1}[\phi_{34}] = \sum_{i=1}^{32} g_{mi} V_{in}[\phi_i] T_{ck} \quad (3)$$

where $T_k$ is the sample period. Since the charge is accumulated on the capacitor, the output voltage at the evaluation phase is as follows:

$$V_0[\phi_{34}] = \frac{T_{ck}}{C} \sum_{i=1}^{32} g_{mi} V_{in}[\phi_i]. \quad (4)$$

Employing the Z-transform of the discrete time equation leads to the following:

$$V_o[z]|_{\phi_{34}} = \left(\frac{T_{ck}}{C}\right)\left(\sum_{i=1}^{32} g_{mi} z^{-i}\right) V_{in}[z] = \left(\frac{T_{ck}}{C} g_{m1} V_{in}[z]\right)\left(\sum_{i=1}^{32} a_i z^{-i}\right) \quad (5)$$

where the coefficient $a_1 = 1$ and all other coefficients $a_{2-32} = g_{m2-32}/g_{m1}$. It can be ascertained that (5) resembles a typical discrete time filter transfer function, thus enabling an FIR topology where the filter coefficients were implemented by ratios of transconductances, making the overall filter shape less sensitive to process, voltage, and temperature (PVT) variations. The in-band gain of this FIR realization was sensitive to PVT variations but a simple servo mechanism can be added to make $G_{m1}$ independent of PVT variations.

Figure 13:
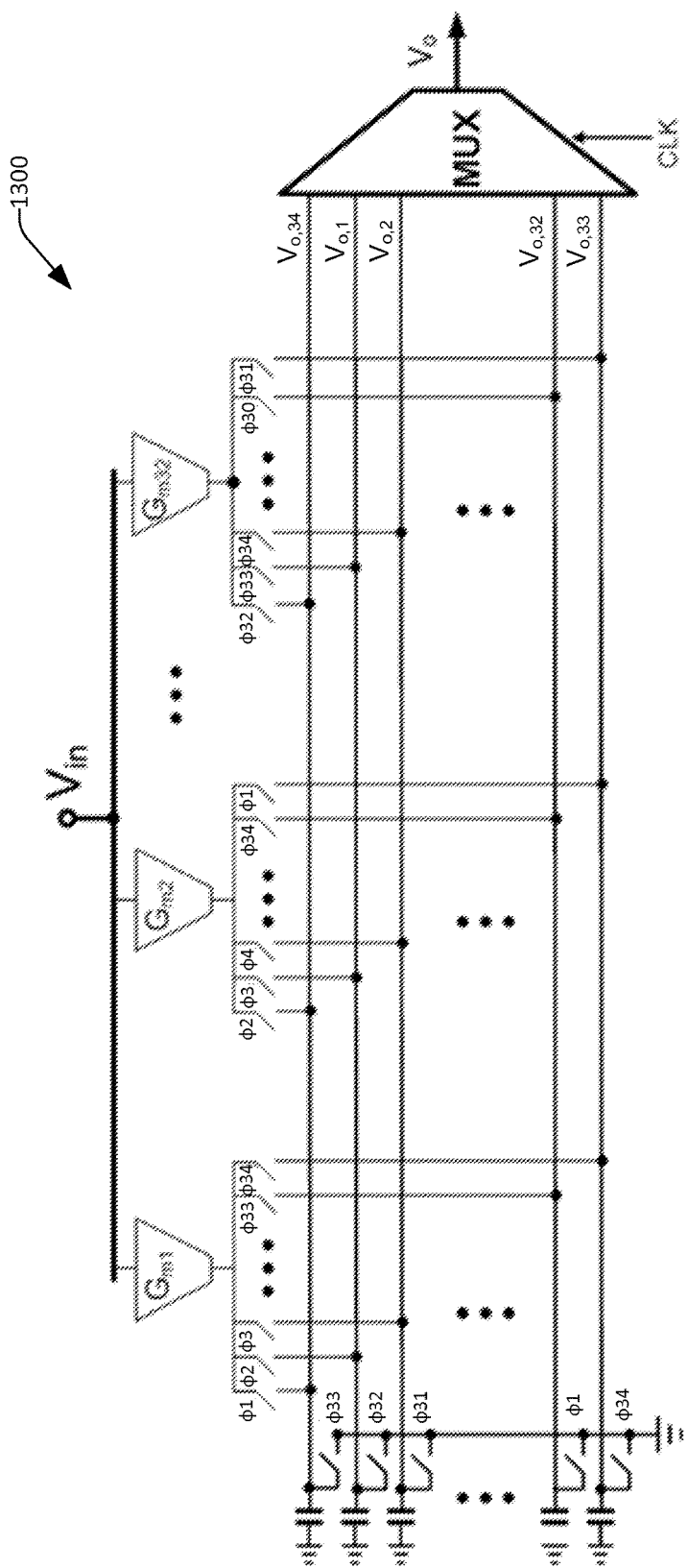
FIG. 13 is a schematic of an exemplary programmable FIR filter.

Although the architecture depicted in FIG. 12 is interesting, the sampling rate is only $T_{ck}/34$, which may be too slow for some applications. FIG. 13 depicts a schematic of an exemplary FIR filter 1300, which is an extension to the FIR topology shown in FIG. 12. In this case, the programmable FIR filter 1300 includes additional capacitors and a multiplexor to allow the output signal to be taken from one of the capacitors during each clock cycle.

Figure 14:
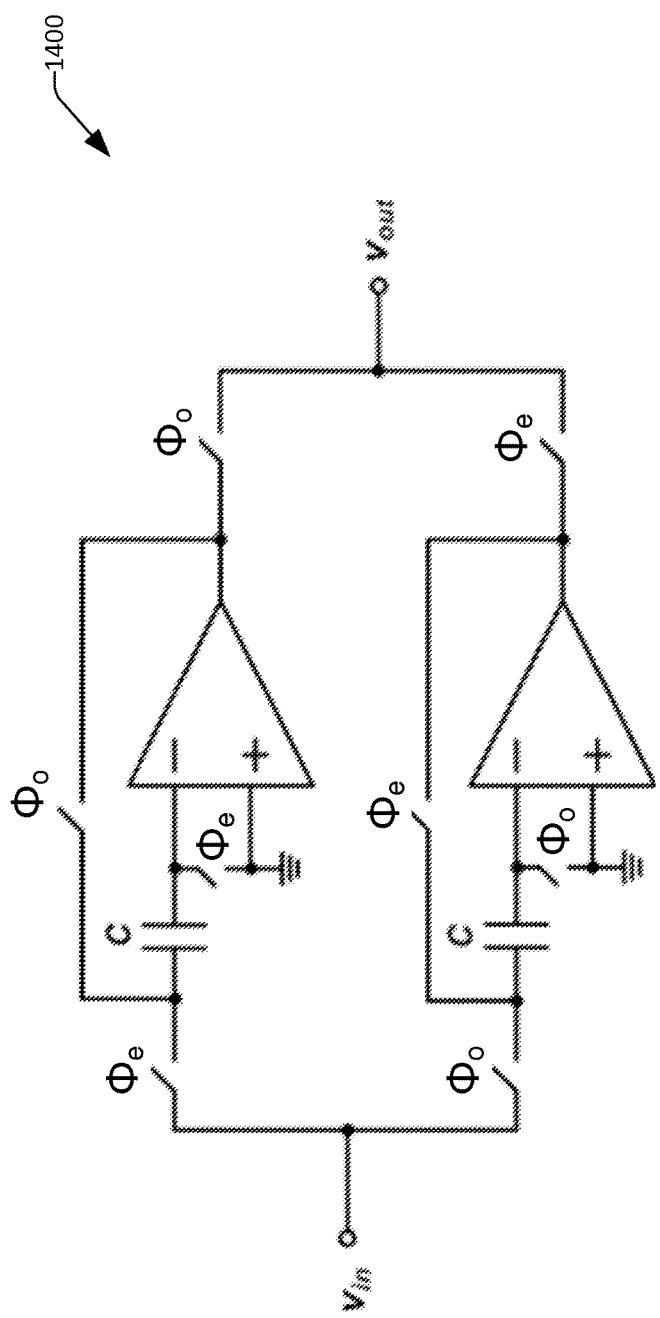
FIG. 14 is a schematic of an exemplary sample and hold circuit.

As noted above, the input to the FIR filter 206 can be constant during each clock period so that the charge injected onto the capacitor is proportionate to the sampled input voltage. Due to this, a typical sample and hold circuit that uses half of the clock period to track the input signal cannot be used. Turning briefly to FIG. 14, a schematic of an exemplary sample and hold circuit 1400 (single-ended representation for simplicity) is illustrated, where the circuit 1400 corresponds to a time-interleaved approach. During one clock period, one of the two sample and hold circuits will track the input, while the other holds a constant value. These operations will then switch for the next clock cycle, and so on. The sample and hold circuits each require two non-overlapping clock phases; one clock will turn the switches on to sample the input voltage onto the capacitor, while the second clock will be used to put the capacitor in feedback around the amplifier during the hold phase.

The output of the sample and hold circuit 204 is ideally constant during the entire hold phase, which would allow the following transconductor cells and capacitors in the FIR filter 206 to perform the desired integration. The sample and hold circuit 206 output, however, if a single pole amplifier is employed, can be approximated to be as follows:

$$V_{O,SH}(t) = V_{O,ideal}(1 - e^{-t \times GBW}) \quad (6)$$

where GBW is the gain-bandwidth product of the amplifier loop gain (including loading and feedback factor), and $V_{O,ideal}$ is the output voltage after full settling. The output voltage of the sample and hold circuit 204 drives the filter section, and each FIR transconductor current is then integrated; thus, the final voltage increment on one of the capacitors of the filter shown in FIG. 13 during one clock cycle will be as follows:

$$V_C(t) = \frac{1}{C} \int_0^{T_{ck}} g_{m,j} V_{O,SH}(1 - e^{-t \times GBW}) dt \quad (7)$$

$$= \frac{1}{C} g_{m,i} V_{O,SH} \left(T_{ck} + \frac{1}{GBW}(e^{-t \times GBW} - 1)\right).$$

In an ideal case, with infinite gain-bandwidth product, the voltage increment on the capacitor would be $$V_{C,ideal} = \left(\frac{g_{m,i}}{C} T_{ck}\right) V_{O,SH}. \quad (8)$$

Subtracting (7) from (8) provides the coefficient error, which is approximated as $1/(GBW \times T_{ck})$, with GBW in Radians per second. For a sample rate of 75 MHz and an amplifier gain bandwidth product of 600 MHz, the error accumulated in a clock period is around 2%.

Figure 15:
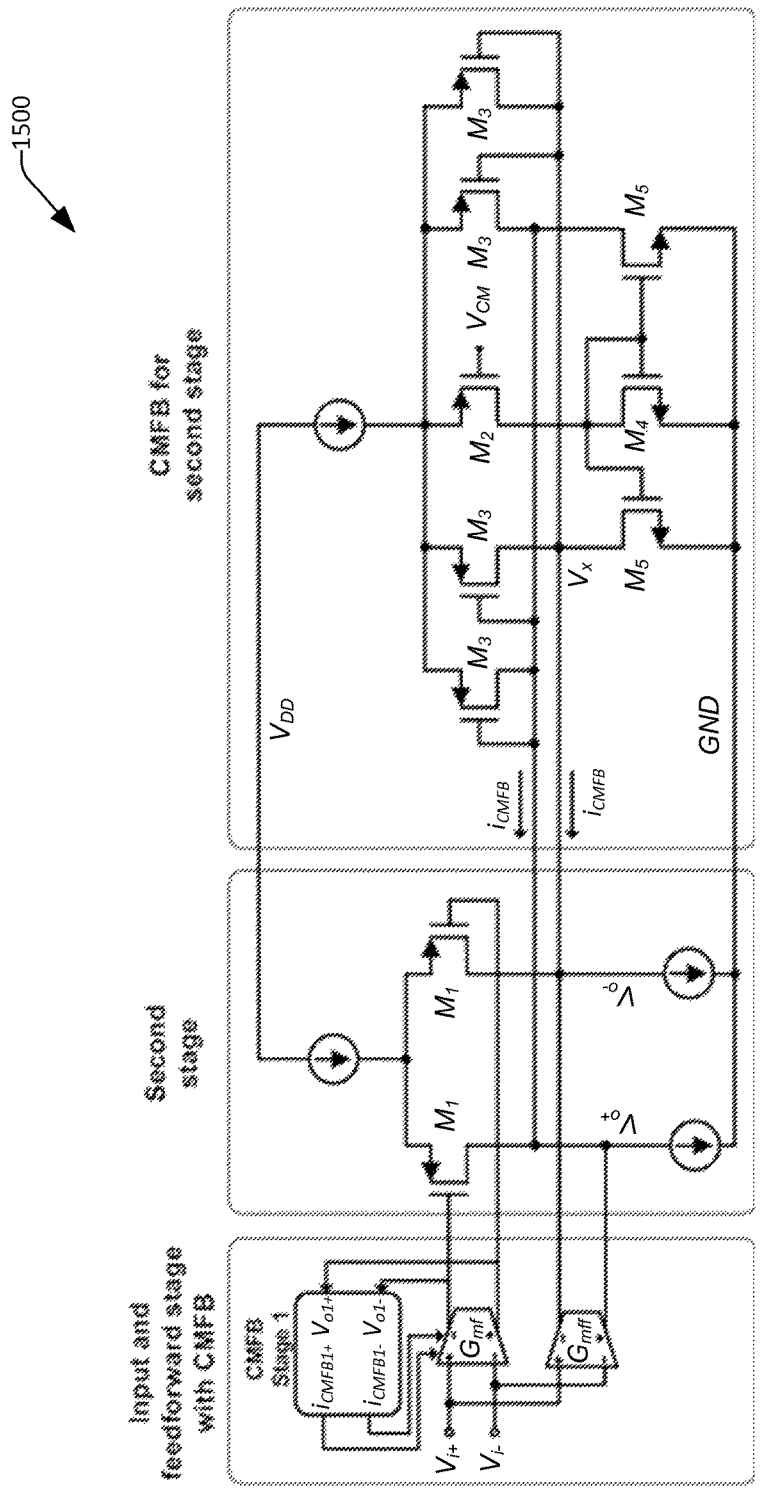
FIG. 15 is a schematic of an exemplary amplifier.

Succeeding the sample and hold circuit 206 is the set of 32 transconductors shown in FIG. 13, which (in an exemplary implementation) has a total input capacitance of approximately 3.8 pF. An exemplary amplifier topology is a two-stage amplifier with a low-power, high gain folded cascode configuration in the first stage with a high-power feedforward stage for amplifier stability. A simplified schematic of an amplifier 1500 is shown in FIG. 15. The common mode feedback is realized by employing transistors $M_3$-$M_5$. Due to the cross-coupling of the $M_3$ transistors, there is no differential mode current injected back into the amplifier output. For common mode signals, assuming $g_{m2}$ is four times that of $g_{m3}$, the CMFB current can be calculated to be:

$$i_{CMFB} = 2 \times g_{m3}(V_{CM} - V_{cm,out}) \quad (9)$$

where $V_{cm,out}$ is the common mode voltage of the amplifier output. The common mode transconductance of the CMFB shows a high-frequency response due to the lack of parasitic poles while setting the DC output to $V_{CM}$ and improving CMRR. The CMFB for the first stage uses the same topology as the second stage, but with lower power.

One of the main challenges in the design of the programmable FIR filter 206 is the design of tunable transconductors. Table 2, set forth below, lists transconductances needed to meet an exemplary set of bandwidths.

TABLE 2

| \multicolumn{6}{l}{Desired Gm values for the set of tunable transconductors in μA/V} | | | | | |
|---|---|---|---|---|---|
| Tap Number | 1.5 MHz | 2 MHz | 3 MHz | 4 MHz | 5 MHz |
| 1, 31 | 0.0 | 0.0 | 0.0 | 0.0 | 0.0 |
| 2, 30 | 0.0 | 0.0 | 0.0 | 0.0 | 0.0 |
| 3, 29 | −2.7 | 0.0 | 0.0 | 0.0 | 0.7 |
| 4, 28 | 0.0 | 0.0 | 0.0 | 0.0 | −0.5 |
| 5, 27 | 4.5 | 2.1 | 0.0 | 0.0 | −2.1 |
| 6, 26 | −3.2 | −1.8 | 0.0 | 0.0 | 1.4 |
| 7, 25 | −6.5 | −4.4 | 0.0 | 0.0 | 2.3 |
| 8, 24 | 6.6 | 5.2 | −2.5 | 0.0 | −1.0 |
| 9, 23 | 7.9 | 7.1 | −4.8 | −3.0 | 1.0 |
| 10, 22 | −11.2 | −11.0 | 9.4 | 7.6 | −5.4 |
| 11, 21 | −7.9 | −8.4 | 8.3 | 7.8 | −6.9 |
| 12, 20 | 16.2 | 18.3 | −20.2 | −20.8 | 20.5 |
| 13, 19 | 6.0 | 7.1 | −8.5 | −9.2 | 9.7 |
| 14, 18 | −20.1 | −24.6 | 31.0 | 25.0 | −38.3 |
| 15, 17 | −2.2 | −2.8 | 3.6 | 4.2 | −4.7 |
| 16 | 21.5 | 27.1 | −35.6 | −41.3 | 46.5 |
| Tap Number | 6 MHz | 7.5 MHz | 10 MHz | 12.5 MHz | 15 MHz |
| 1, 31 | 0.3 | 0.4 | 0.2 | 0.4 | 0.2 |
| 2, 30 | 0.0 | −0.1 | 0.0 | −0.1 | 0.0 |
| 3, 29 | 0.1 | −0.7 | 0.8 | −0.4 | 1.0 |
| 4, 28 | −0.3 | 0.1 | −0.5 | −0.2 | −0.4 |
| 5, 27 | −1.8 | −0.6 | −1.6 | −1.9 | −0.4 |
| 6, 26 | 1.6 | 1.2 | 0.4 | 1.5 | −1.0 |
| 7, 25 | 3.3 | 3.6 | −1.4 | 1.7 | −3.6 |
| 8, 24 | −2.5 | −3.9 | 3.6 | 1.0 | 2.7 |
| 9, 23 | −1.0 | −3.5 | 5.6 | 4.8 | −0.9 |
| 10, 22 | −2.8 | 1.2 | −6.6 | −9.3 | 8.1 |
| 11, 21 | −5.6 | −3.3 | −1.0 | −4.7 | 7.5 |
| 12, 20 | 19.4 | 16.7 | −10.2 | −2.6 | −7.2 |
| 13, 19 | 9.9 | 10.0 | −9.2 | −7.7 | 4.9 |
| 14, 18 | −41.1 | −44.8 | 48.5 | 50.5 | −49.7 |
| 15, 17 | −5.1 | −5.8 | 6.8 | 7.7 | −8.6 |
| 16 | 51.4 | 59.1 | −70.5 | −81.9 | 94.9 |

Ranging in transconductances from about 90 μA/V to less than 1 μA/V, each transconductor cell are to be tunable in both magnitude and polarity across a broad range of values that do not follow any sort of common pattern between varying filter bandwidth selections. For each filter setting, there are only 16 different transconductance values needed since the filter is symmetric. In an implementation, a few of the very small transconductance values were set to 0; doing this had little effect in the shape of the filter in the passband—only a slight decrease in stop-band attenuation occurs. Since desired transconductance values may vary by several orders of magnitude, it would be inefficient to design a single device that can meet every desired transconductance value. In the design described herein, five different transconductors were designed that have the following transconductance tuning ranges: 0.2 to 2 μA/V, 0.7 to 6 μA/V, 1-11 μA/V, 4-20 μA/V, and 20-90 μA/V.

Figures 16A, 16B:
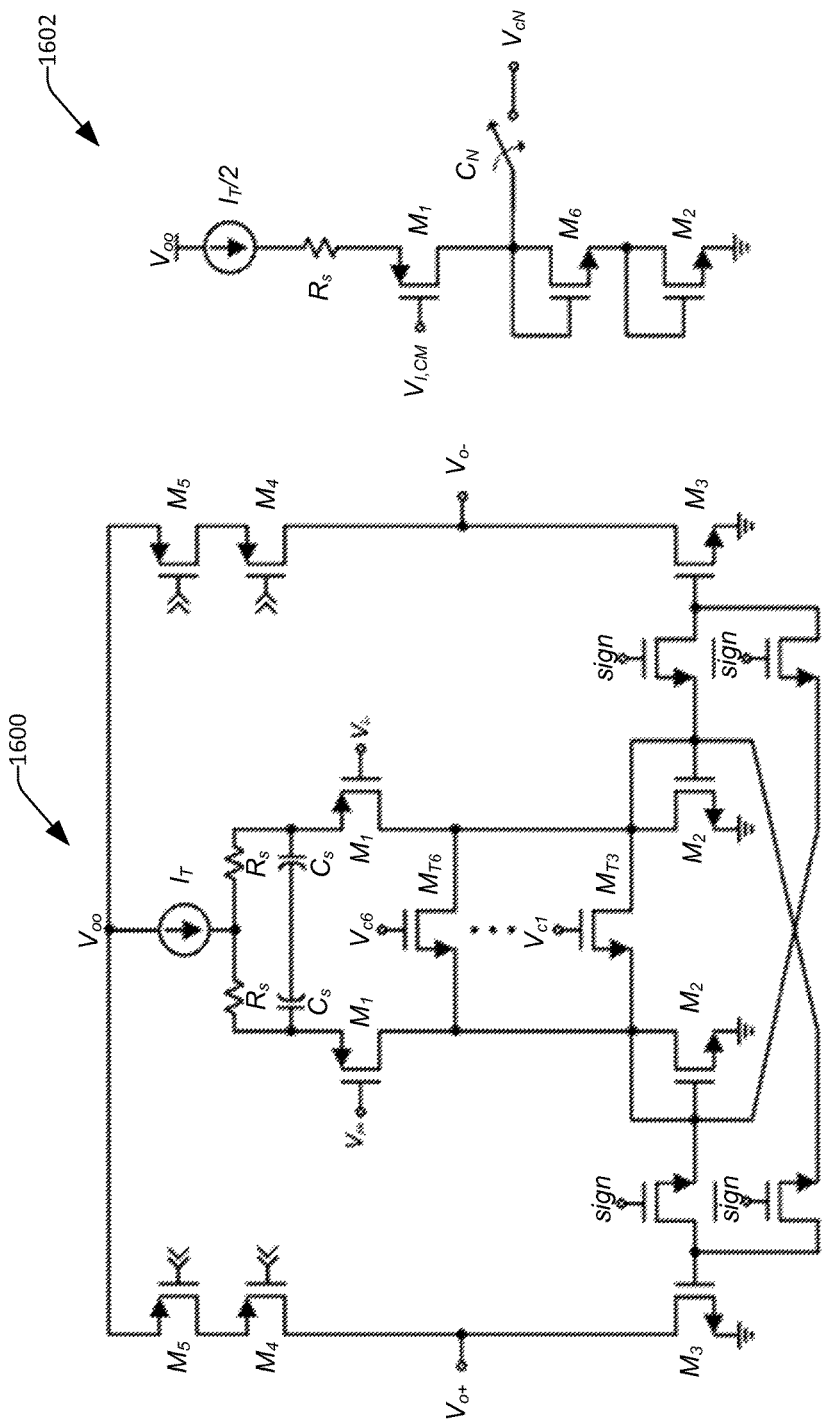
FIG. 16A illustrates a schematic of an exemplary tunable transconductor.
FIG. 16B depicts a schematic of an exemplary replica circuit that is usable to tune a tunable transconductor.

FIG. 16A illustrates a schematic of an exemplary circuit 1600, which is an implementation of the tunable transconductor 1104. The circuit includes a pair of transistors M1, which form a basic source degenerated differential pair with a current mirror load. Transistors MT1-MT6 are placed across the drain of the transistors M1 in the differential pair, and along with the replica circuit 1602 shown in FIG. 16B, are used to tune the transconductance by attenuating the differential current entering the current mirror load. The tuning transistors operate in the triode region when activated, and present a resistance of $R_{tune}$ that is controlled by the gate voltage equal to $2 \times V_{gs2}$. Due to the current division, the total low-frequency current being mirrored from M2 to M3 is then computed as follows:

$$i_{out} = V_{in} \cdot \frac{g_{m1}}{1 + g_{m1} R_S} \cdot \frac{\frac{R_{tune}}{2}}{\frac{R_{tune}}{2} + \frac{1}{g_{m2}}} \quad (10)$$

Due to the replica circuit 1602 of FIG. 16B, the overdrive voltage $V_{GS} - V_T$ of M2 and MT is similar, which gives an overall amplifier's low-frequency transconductance that can be approximated as:

$$G_m = \frac{g_{m1}}{1 + g_{m1} R_S} \cdot \frac{1}{1 + 2 \cdot \frac{(W/L)_T}{(W/L)_2}}. \quad (11)$$

The transconductance can, thus, be tuned by adjusting the ratio of two transistor dimensions which are reliable with PVT variations. The tuning is carried out through a bank of transistors that allow for the adjustment of $(W/L)_T$ without affecting the OTA operating point. $g_m$ itself, however, is susceptible to PVT variations, which can give a gain error in the FIR filter 206. A tuning scheme can be employed if better accuracy is needed in the FIR filter gain.

The input referred thermal noise of the transconductor cells is a function of the OTA transconductance values, and can be calculated to be:

$$v_{n,in}^2 = 8kT\left(\frac{1+g_{m1}R_S}{g_{m1}}\right)^2 \left[ \frac{\gamma}{A_{cd}^2}(g_{m3}+g_{m5}) + \gamma g_{m2} + \frac{2}{r_{ds,T}} + (R_s g_{m1}^2 + \gamma g_{m1})\left(\frac{1}{1+g_{m1}R_S}\right)^2 \right] \quad (12)$$

where $\gamma$ is the noise-fitting factor, and is typically between ⅔ and 1. Meanwhile, the $A_{cd}$ factor represents the current division gain between the diode connected transistor M2 and the tuning transistor MT, which is expressed as:

$$A_{cd} = \frac{g_{m2}r_{ds,T}}{2+g_{m2}r_{ds,T}} \quad (13)$$

This results in a noise power density ranging from −149 dBm/Hz$^{1/2}$ when all of the tuning switches are off (maximum transconductance gain) to about −121 dBm/Hz$^{1/2}$ when they are all switched on (minimum transconductance gain), which is the worst case since the current division factor is maximum under these conditions.

According to Table 2, the two most dominant transconductors, $gm_{14}$ and $gm_{16}$, will both have their highest noise level when the filtered bandwidth is at its minimum; therefore, total integrated noise will stay fairly constant across bandwidth selections. This result agrees with the fact that noise is usually dominated by kT/C, and in this filter realization the load capacitor remains constant. Table 3 lists exemplary sizes of transistors, capacitors, and resistors for the 20 μA/V to 90 μA/V transconductor, where all sizes are in μm.

TABLE 3

| Component | Size |
|---|---|
| M1 | 16/1 |
| M2 | 3/1 |
| M3 | 3/1 |
| M4 | 10/0.4 |
| M5 | 10/0.4 |
| M6 | 3/1 |
| MT | 0.22/0.8 to 3.52/0.8 |
| Rs | 4 kΩ |
| $C_s$ | 650 fF |

The other four tunable transconductors are scaled-down versions of this cell. Five control bits can be used to achieve the values needed to generate the FIR filter coefficients. An additional sixth control bit can be used to provide polarity control to switch the transconductor sign between positive and negative.

Table 4 summarizes performance metrics of the 20-90 μA/V transconductors. The other four tunable transconductors had similar performance.

TABLE 4

| Specification | Value |
|---|---|
| Gm Range | 20 - 90 μA/V |
| IIP3 | >16 dBm |
| Power Noise density | <−132 dBm/Hz$^{1/2}$ |

TABLE 4-continued

| Specification | Value |
|---|---|
| Power Consumption | 316 μW |

Figure 17:
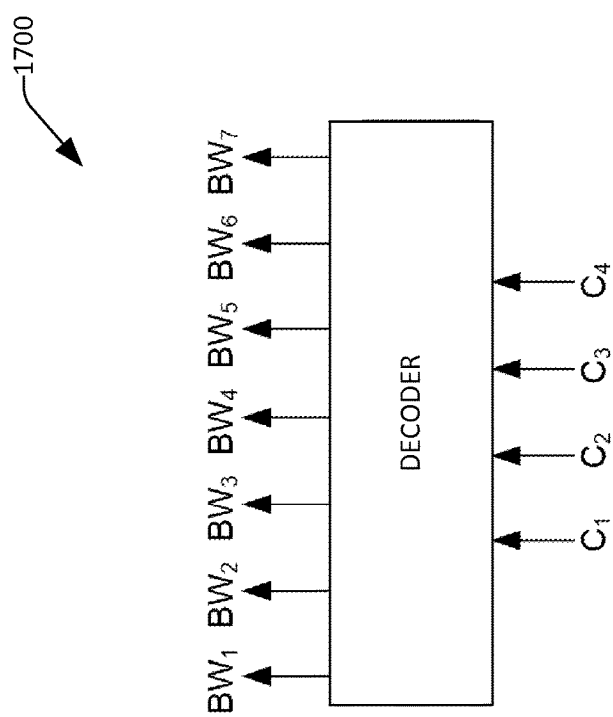
FIG. 17 is a functional block diagram of an exemplary decoder circuit.

FIG. 17 illustrates an exemplary decoder 1700 that can be included in the programmable FIR filter 206. The decoder 1700 can receive, as input, four control signals which are the output of 1000 (FIG. 10), and can select a bandwidth for tuning the FIR filter 206 as a function of the four control signals.

Figure 18:
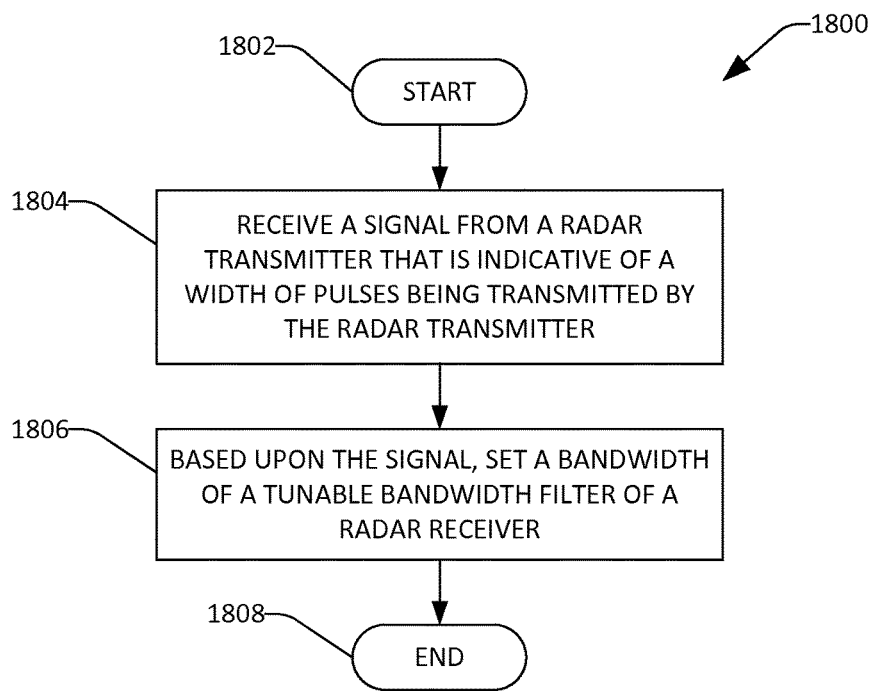
FIG. 18 is a flow diagram illustrating an exemplary methodology for setting bandwidth of a tunable bandwidth filter.
Figure 19:
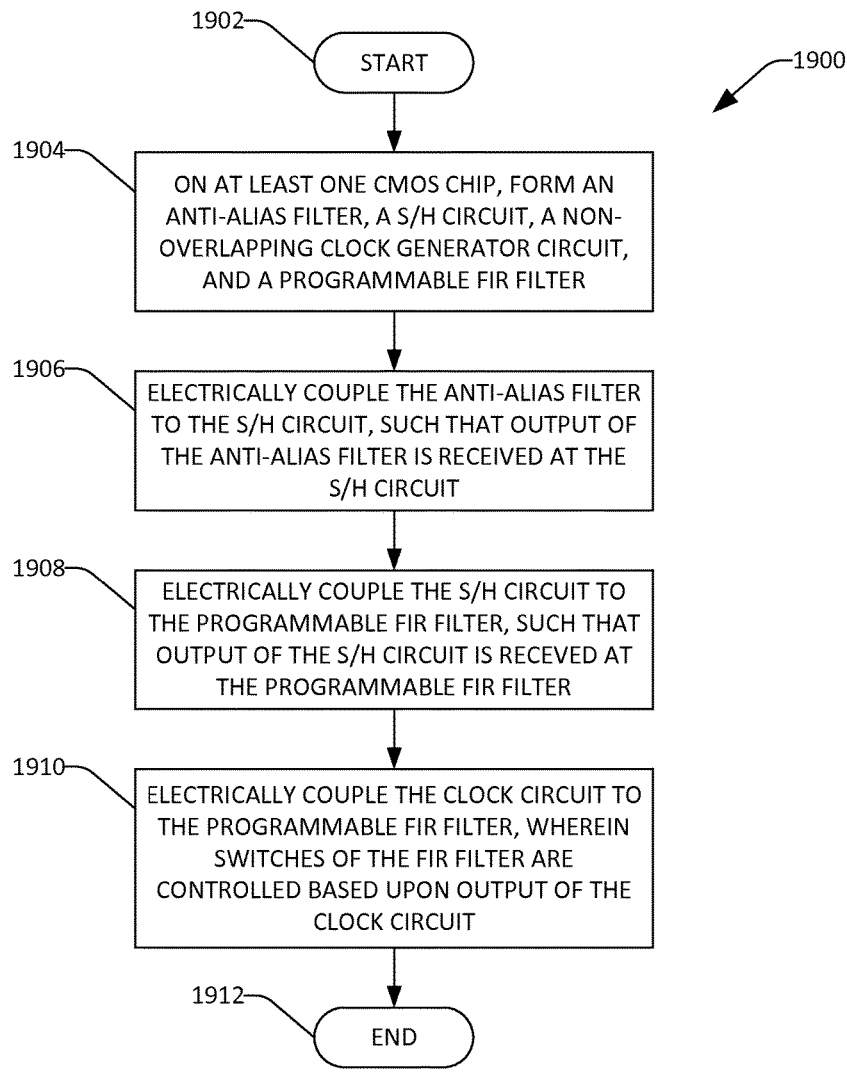
FIG. 19 is a flow diagram illustrating an exemplary methodology for forming a tunable bandwidth filter.
Figure 20:
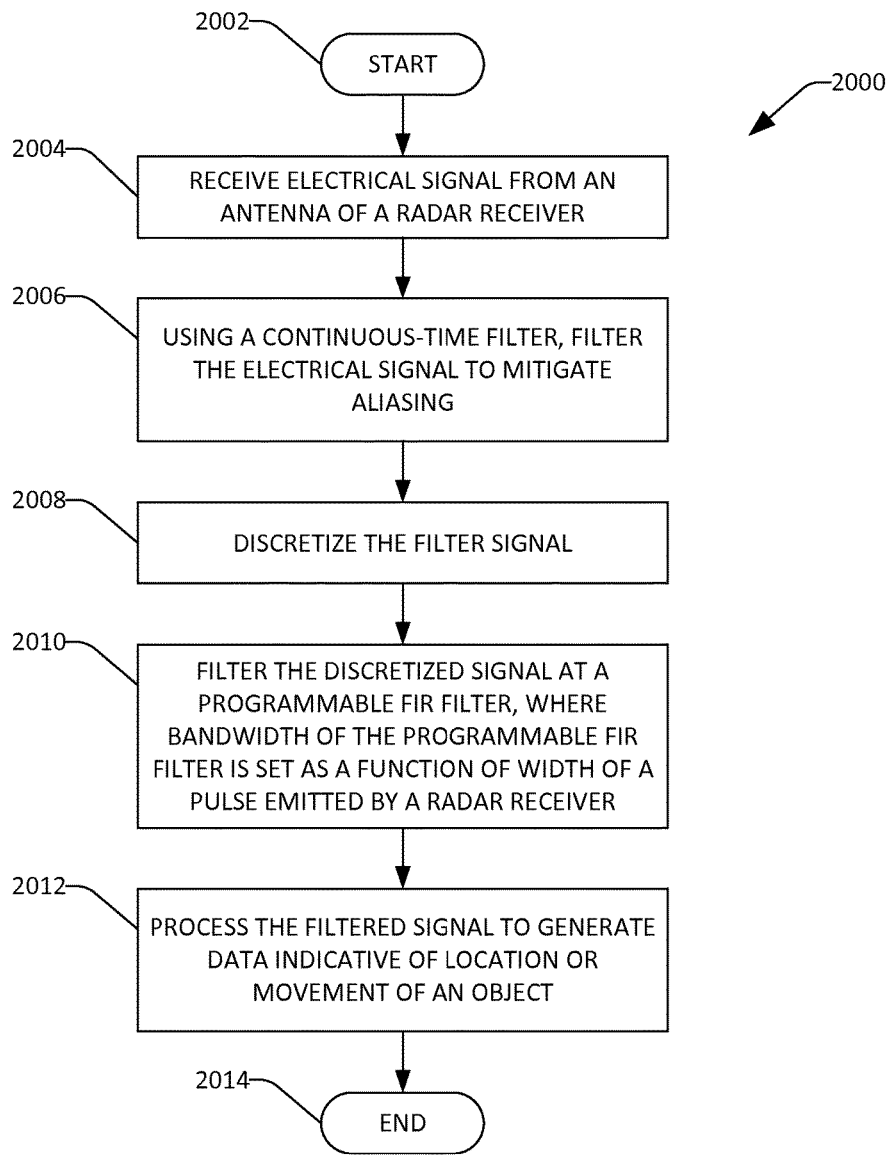
FIG. 20 is a flow diagram illustrating an exemplary methodology for processing an analog signal at a radar receiver.

FIGS. 18-20 illustrate exemplary methodologies relating to operation and formation of a variable bandwidth filter. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Referring now to FIG. 18, an exemplary methodology 1800 that facilitates setting a passband of an adjustable bandwidth filter is illustrated. The methodology 1800 starts at 1802, and at 1804 a signal from a radar transmitter is received, where the signal is indicative of a width of pulses of radio energy being transmitted by the radar transmitter. At 1804, based upon the signal, a passband of the tunable bandwidth filter in a radar receiver is set. Accordingly, the bandwidth of the passband of the filter varies as the width of the pulses emitted by the radar transmitter vary. The methodology 1800 completes at 1806. While the methodology 1800 illustrates one exemplary technique for setting bandwidth of a passband of a filter, other techniques are also contemplated. In an example, rather than the transmitter communicating information that is indicative of a desired bandwidth to the receiver, the receiver can compute the bandwidth based solely upon a detected signal. For example, an iterative bandwidth detection process can be employed to determine a desired bandwidth of the passband of the filter.

With reference now to FIG. 19, an exemplary methodology 1900 pertaining to forming a programmable bandwidth filter is illustrated. The methodology 1900 starts at 1902, and at 1904, on at least one CMOS chip, an anti-alias filter, a sample and hold circuit, a non-overlapping clock generator circuit, and a programmable FIR filter are formed. At 1906, the anti-alias filter is electrically coupled to the sample and hold circuit, such that output of the anti-alias filter is received at the sample and hold circuit.

In 1908, the sample and hold circuit is electrically coupled to the programmable FIR filter, such that output of the sample and hold circuit is received at the programmable FIR filter. At 1910, the clock circuit is electrically coupled to the programmable FIR filter, wherein switches of the FIR filter are controlled based upon output of the clock circuit. The method of 1900 completes at 1912.

Turning now to FIG. 20, an exemplary methodology pertain to operation of an adjustable bandwidth filter is illustrated. The methodology 2000 starts at 2002, and at 2004, an electrical signal is received from an antenna of a radar receiver. At 2006, using a continuous time filter, the electrical signal is filtered to mitigate aliasing therein. Output of the continuous time filter can be referred to as a filtered signal.

At 2008, the filter signal is discretized (e.g. through use of a sample and hold circuit). At 2010, the discretized signal is filtered at a programmable FIR filter, where bandwidth of the programmable FIR filter is set as a function of width of a pulse emitted by a radar receiver. At 2012, the filtered signal is processed to generate data indicative of location or movement of an object. The methodology 2000 completes the 2014.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A semiconductor chip comprising:
a variable bandwidth filter that is configured to filter an analog signal, wherein a bandwidth of a passband of the variable bandwidth filter is dynamically programmable, the variable bandwidth filter comprising a transconductor, the transconductor comprising:
a differential pair of transistors comprising a first transistor and a second transistor, the first transistor has a first drain, the second transistor has a second drain; and
a plurality of tuning transistors that are placed across the first drain of the first transistor and the second drain of the second transistor, wherein a first tuning transistor in the tuning transistors comprises a source and a drain, the source of the first tuning transistor connected to the first drain of the first transistor in the differential pair of transistors, the drain of the first tuning transistor connected to the second drain of the second transistor in the differential pair of transistors.

2. The semiconductor chip of claim 1, further comprising a control circuit that transmits a control signal to the variable bandwidth filter, the passband of the variable bandwidth filter is set based upon the control signal.

3. The semiconductor chip of claim 2 comprised by a radar receiver.

4. The semiconductor chip of claim 3, the control circuit generates the control signal based upon a pulse width of radio energy transmitted by a radar transmitter.

5. The semiconductor chip of claim 1, the variable bandwidth filter comprising a finite impulse response (FIR) filter.

6. The semiconductor chip of claim 5, the variable bandwidth filter comprising a plurality of FIR filters that are electrically connected to one another in series.

7. The semiconductor chip of claim 5, the FIR filter comprises a plurality of transconductors, wherein each transconductor in the plurality of transconductors is tunable in transconductance gain.

8. The semiconductor chip of claim 1, wherein the bandwidth of the passband is tunable from about 1.5 MHz to about 15 MHz.

9. A method comprising:
forming a variable bandwidth filter on a semiconductor chip, wherein a bandwidth of a passband of the variable bandwidth filter is dynamically tunable, wherein forming the variable bandwidth filter comprises forming a transconductor, and wherein forming the transconductor comprises:
forming a differential pair of transistors; and
forming a plurality of tuning transistors that are placed across drains of the transistors in the differential pair such that a source of a first tuning transistor in the plurality of tuning transistors is connected to a drain of a first transistor in the differential pair of transistors and a drain of the first tuning transistor is connected to a drain of a second transistor in the differential pair of transistors.

10. The method of claim 9, wherein forming the variable bandwidth filter comprises forming a finite impulse response (FIR) filter, the FIR filter comprises a plurality of tunable transconductors.

11. The method of claim 10, wherein forming the variable bandwidth filter comprises:
forming an anti-alias filter on the semiconductor chip, wherein the anti-alias filter is a low-pass filter that is configured to filter a received analog signal; and
electrically coupling the FIR filter with the anti-alias filter, wherein the FIR filter is configured to receive a derivative of a filtered signal output by the anti-alias filter.

12. The method of claim 11, wherein forming the variable bandwidth filter further comprises:
forming a sample and hold circuit on the semiconductor chip, wherein the sample and hold circuit is configured to receive the filtered signal output by the anti-alias filter and generate a discretized signal, and further wherein the FIR filter is configured to receive the discretized signal.

13. The method of claim 10, wherein each of the tunable transconductors is tunable in gain.

14. The method of claim 13, wherein forming the variable bandwidth filter further comprises:
forming a plurality of FIR filters on the semiconductor chip; and
electrically coupling the plurality of FIR filters to one another.

15. The semiconductor chip of claim 1, wherein the bandwidth of the passband of the variable bandwidth filter is dynamically programmable by way of the plurality of tuning transistors.

16. The method of claim 9, wherein the bandwidth of the passband of the variable bandwidth filter is dynamically programmable by way of the plurality of tuning transistors.

* * * * *